(12) United States Patent
Ashdown et al.

(10) Patent No.: US 8,686,625 B1
(45) Date of Patent: Apr. 1, 2014

(54) ENGINEERED-PHOSPHOR LED PACKAGES AND RELATED METHODS

(71) Applicants: Ian Ashdown, West Vancouver (CA); Michael A. Tischler, Vancouver (CA); Philippe M. Schick, Vancouver (CA); Tom Pinnington, Vancouver (CA); Henry Ip, Richmond (CA)

(72) Inventors: Ian Ashdown, West Vancouver (CA); Michael A. Tischler, Vancouver (CA); Philippe M. Schick, Vancouver (CA); Tom Pinnington, Vancouver (CA); Henry Ip, Richmond (CA)

(73) Assignee: Cooledge Lighting Inc., Burnaby (CA)

( * ) Notice: Subject to any disclaimer, the term of this patent is extended or adjusted under 35 U.S.C. 154(b) by 0 days.

(21) Appl. No.: 13/863,926

(22) Filed: Apr. 16, 2013

Related U.S. Application Data

(63) Continuation of application No. 13/828,498, filed on Mar. 14, 2013.

(51) Int. Cl.
  *H01L 33/50* (2010.01)
  *H01L 33/54* (2010.01)
  *H01L 33/58* (2010.01)

(52) U.S. Cl.
  USPC ............. 313/501; 313/512; 313/484; 257/98

(58) Field of Classification Search
  USPC ............. 313/498–512, 483–487; 257/98–100
  See application file for complete search history.

(56) References Cited

U.S. PATENT DOCUMENTS

| | | | | |
|---|---|---|---|---|
| 4,638,343 | A | * | 1/1987 | Althaus et al. .................. 257/98 |
| 5,289,082 | A | * | 2/1994 | Komoto ......................... 313/500 |
| 6,050,707 | A | * | 4/2000 | Kondo et al. .................. 313/512 |
| 2004/0000862 | A1 | * | 1/2004 | Setlur et al. .................... 313/501 |
| 2008/0105886 | A1 | * | 5/2008 | Borner et al. .................... 257/98 |
| 2012/0037934 | A1 | * | 2/2012 | Lee ................................. 257/98 |

* cited by examiner

*Primary Examiner* — Mariceli Santiago
(74) *Attorney, Agent, or Firm* — Bingham McCutchen LLP

(57) ABSTRACT

In accordance with certain embodiments, a phosphor element at least partially surrounding a light-emitting die is shaped to influence color-temperature divergence.

30 Claims, 17 Drawing Sheets

US 8,686,625 B1

ENGINEERED-PHOSPHOR LED PACKAGES AND RELATED METHODS

RELATED APPLICATION

This application is a continuation of U.S. patent application Ser. No. 13/828,498, filed Mar. 14, 2013, the entire disclosure of which is incorporated by reference herein.

FIELD OF THE INVENTION

In various embodiments, the present invention generally relates to light-emitting diodes (LEDs) and, in particular, to LED dies packaged with engineered phosphor layers and lighting systems incorporating such LED dies.

BACKGROUND

An increasing number of light fixtures utilize LEDs as light sources due to their lower energy consumption, smaller size, improved robustness, and longer operational lifetime relative to conventional filament-based light sources. Conventional LEDs emit quasi-monochromatic radiation ranging from infrared through the visible spectrum to ultraviolet. Conventional LEDs emit light at a particular wavelength, ranging from, for example, red to blue or ultraviolet (UV) light. However, for purposes of general illumination, the relatively narrow spectral width of light emitted light by LEDs is generally converted to broad-spectrum white light.

Traditionally, there are two ways of obtaining white light from LEDs. One approach utilizes two or more LEDs operating at different wavelengths, where the different wavelengths are chosen such that their combination appears white to the human eye. For example, one may use LEDs emitting in the red, green, and blue wavelength ranges. Such an arrangement typically requires careful control of the operating currents of each LED, such that the resulting combination of wavelengths is stable over time and different operating conditions, for example temperature. Because the different LEDs may be formed from different materials, different operating parameters may be required for the different LEDs; this complicates the LED circuit design. Furthermore, such systems typically require some form of light combiner, diffuser or mixing chamber, so that the eye sees white light rather than the distinct colors of each of the different LEDs. Such light-mixing systems typically add cost and bulk to lighting systems and may reduce their efficiency.

White light may also be produced in LED-based systems for general illumination via the utilization of wavelength-conversion materials (also called light-conversion materials) such as phosphors, sometimes called phosphor-converted LEDs. For example, an LED combined with a wavelength-conversion material generates white light by combining the short-wavelength radiant flux (e.g., blue light) emitted by the semiconductor LED with long-wavelength radiant flux (e.g., yellow light) emitted by the wavelength conversion material. The chromaticity (or color), color temperature, and color-rendering index are determined by the relative intensities of the component colors. For example, the light color may be adjusted from "warm white" with a correlated color temperature (CCT) of 2700 Kelvin or lower to "cool white" with a CCT of 6500 Kelvin or greater by varying the type or amount of phosphor material. White light may also be generated solely or substantially only by the light emitted by the one or more wavelength conversion materials.

In isolation, bare LED dies generally exhibit a Lambertian luminous intensity distribution pattern, as shown in FIG. 1A, that is a consequence of the light being uniformly emitted from a planar surface. (That is, the projected area of its light-emitting region decreases according to the cosine of the viewing angle with respect to the surface normal.)

The wavelength-conversion material is generally one or more phosphor particles. Such particles emit with a substantially isotropic distribution. In a phosphor-converted LED, the phosphor particles are generally embedded into a transparent matrix, for example a silicone, and typically have a substantially hemispherical shape surrounding the die with the die positioned at the equator and in the center of the hemisphere. The hemispherical shape is used because it generally results in relatively high light extraction efficiency because of reduced total internal reflection (TIR) at the phosphor/air interface. The intensity distribution of isotropic emitting phosphor particles in a hemispherical transparent matrix is shown in FIG. 1B.

As may be seen by comparing FIGS. 1A and 1B, the intensity distributions of a bare-die LED and embedded phosphor particles are different. This difference results in the chromaticity of the combined light varying with viewing angle, resulting in a non-uniform color distribution as seen by the human eye. For example, a phosphor-coated blue LED may be typically perceived as being cool white when viewed head-on, but warm white when viewed obliquely. Thus, while the hemispherical shape provides relatively high efficiency, it suffers from relatively poor color temperature uniformity with angle.

In order to mitigate the relatively poor angular color uniformity of conventional phosphor-converted LEDs, illumination systems incorporating such phosphor-converted LEDs often require additional elements, such as diffusers, mixing chambers, or the like, to homogenize the color characteristics. Such homogenization often degrades the light-intensity distribution pattern, however, resulting in the need for secondary optics to attempt to re-establish the desired light-intensity distribution pattern. The addition of these elements typically requires undesirable additional space or volume, adds cost and expense, and reduces output efficiency.

Accordingly, there is a need for structures, systems and procedures enabling LED-based illumination systems to generate uniform color distribution of emitted light and operate with high extraction efficiency while utilizing low-cost integration of phosphors with the LEDs.

SUMMARY

In accordance with certain embodiments, one or more phosphor elements at least partially surrounding a light-emitting element (LEE) are shaped to improve uniformity of chromaticity of light emitted from the LEE as a function of viewing angle. The phosphor element may be formed of a single structure or multiple discrete portions that may be optically coupled and at least a portion of the surface of the phosphor element may be roughened (i.e., textured) to improve light-extraction efficiency from the device. Various embodiments of this invention engineer (1) the angular intensity distribution of the light emitted from the LEE as it exits the surrounding phosphor and (2) the angular intensity distribution of light emitted from the phosphor to achieve a desired angular characteristic of one or more optical parameters, for example to achieve a relatively uniform color temperature with viewing angle.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEE has one lateral dimension less than 500 μm, while in other embodiments a LEE has one lateral dimension greater than 500 um. Exemplary sizes of a relatively small LEE may include about 175 μm by about 250 μm, about 250 μm by about 400 μm, about 250 μm by about 300 μm, or about 225 μm by about 175 μm. Exemplary sizes of a relatively large LEE may include about 1000 μm by about 1000 μm, about 500 μm by about 500 μm, about 250 μm by about 600 μm, or about 1500 μm by about 1500 μm. In some embodiments, a LEE includes or consists essentially of a small LED die, also referred to as a "microLED." A microLED generally has one lateral dimension less than about 300 μm. In some embodiments, the LEE has one lateral dimension less than about 200 μm or even less than about 100 μm. For example, a microLED may have a size of about 225 μm by about 175 μm or about 150 μm by about 100 μm or about 150 μm by about 50 μm. In some embodiments, the surface area of the top surface of a microLED is less than 50,000 $\mu m^2$ or less than 10,000 $\mu m^2$. The size of the LEE is not a limitation of the present invention, and in other embodiments the LEE may be relatively larger, e.g., the LEE may have one lateral dimension on the order of at least about 1000 μm or at least about 3000 μm.

As used herein, "phosphor" refers to any material that shifts the wavelengths of light irradiating it and/or that is fluorescent and/or phosphorescent, and is utilized interchangeably with the term "light-conversion material" or "phosphor-conversion element." As used herein, a "phosphor" may refer to only the powder or particles (of one or more different types) or to the powder or particles with the binder. The light-conversion material is incorporated to shift one or more wavelengths of at least a portion of the light emitted by LEEs to other desired wavelengths (which are then emitted from the larger device alone or color-mixed with another portion of the original light emitted by the die). A light-conversion material may include or consist essentially of phosphor powders, quantum dots, organic dye or the like within a transparent matrix. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention. As used herein, a "phosphor chip" is a discrete piece or layer of phosphor that has been fabricated and cured while unattached to any LEE, and that may be later coupled to an LEE by, e.g., optical bonding or via an optical adhesive.

The binder may also be referred to as an encapsulant or a matrix material. In one embodiment, the binder includes or consists essentially of a transparent material, for example silicone-based materials or epoxy, having an index of refraction greater than 1.35. In one embodiment the phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

Herein, two components such as light-emitting elements, optical elements, and/or phosphor chips being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

In an aspect, embodiments of the invention feature a light emitting device that includes or consists essentially of a light-emitting die having (i) a top face and a bottom face opposite the top face, the top and/or bottom face being configured for emission of light therefrom, and (ii) a sidewall spanning the top and bottom faces, and at least partially surrounding the light-emitting die, a phosphor element including or consisting essentially of (i) a binder and (ii) disposed within the binder, one or more wavelength-conversion materials for absorbing at least a portion of light emitted from the light-emitting die and emitting converted light having a different wavelength. The phosphor element has an outer contour having a curved region that defines only a portion of a hemisphere having a hemisphere radius, and a planar base of the phosphor element has a non-zero centroid z-offset within the hemisphere.

Embodiments of the invention may include one or more of the following in any of a variety of different combinations. The ratio of the centroid z-offset to the hemisphere radius may be a value ranging from 0.3 to 0.8. The bottom face of the light-emitting die may be substantially coplanar with the base of the phosphor element. The ratio of the centroid z-offset to the hemisphere radius may be a value ranging from 0.5 to 0.77. The ratio of the centroid z-offset to the hemisphere radius may be a value ranging from 0.3 to 0.5. The outer contour of the phosphor element may have a planar region disposed over the light-emitting die and substantially parallel to the top face of the light-emitting die. The ratio of a z-offset value of the planar region within the hemisphere to the hemisphere radius may have a value ranging from 0.02 to 0.15. The ratio of a z-offset value of the planar region within the hemisphere to the hemisphere radius may have a value ranging from 0.04 to 0.12. The radius (or other lateral dimension such as width) of the planar region may be a value ranging from 50 μm to 1000 μm. The radius (or other lateral dimension such as width) of the planar region may be a value ranging from 200 μm to 800 μm. The ratio of the centroid z-offset to the hemisphere radius may be approximately defined by $-1.9 \times F + 0.67$, where F is a ratio of the z-offset value of the planar region within the hemisphere to the hemisphere radius. The centroid z-offset value may be approximately defined by $1.41 \times R - 0.8$, where R is the hemisphere radius.

The hemisphere radius may be a value ranging from about 0.2 mm to about 20 mm. The hemisphere radius may be a value ranging from about 0.5 mm to about 5 mm. The hemisphere radius may be a value ranging from about 0.7 mm to about 1.5 mm. The base radius (or width) of the phosphor element may be a value ranging from 0.6 mm and 1.0 mm. The outer contour of the phosphor element may have a planar region disposed over the light-emitting die and substantially parallel to the top face of the light-emitting die. The radius (or width) of the planar region may be a value ranging from about 0.15 mm to about 0.45 mm. The height (distance) from the base of the phosphor element to the planar region may be a value ranging from about 0.15 mm to about 0.5 mm. The outer contour of the phosphor element may have a region defined by a cylindrical cutoff within the hemisphere. The ratio of the length (e.g., dimension parallel to the base of the phosphor element and/or bottom face of the light-emitting die) of the cylindrical cutoff to the hemisphere radius may be a value ranging from 0.75 to 0.95. The length of the cylindrical cutoff may be a value ranging from 50 µm to 500 µm.

Light emitted from the light-emitting die may have a Lambertian distribution. The converted light may have an isotropic distribution. The converted light may combine with unconverted light emitted from the light-emitting die to form substantially white light. The divergence of color temperature of the substantially white light emitted from the device may vary, over an angular range of 0° to 85°, no more than 0.01 in terms of $\Delta u'v'$ deviation from a spatially weighted averaged chromaticity. The divergence of color temperature of the substantially white light emitted from the device may vary, over an angular range of 0° to 85°, no more than 0.005 in terms of $\Delta u'v'$ deviation from a spatially weighted averaged chromaticity. The one or more wavelength conversion materials may include or consist essentially of one or more phosphor particles. The phosphor particles may each include or consist essentially of garnet and a rare-earth element. The device may include, disposed beneath (i) at least a portion of the light-emitting die and/or (ii) the phosphor element, a mounting surface reflective to converted light and/or unconverted light emitted from the light-emitting die. The mounting surface may have a reflectivity to visible light of approximately 95% to approximately 98%. At least a portion of the outer contour of the phosphor element may have a surface texture for reducing total internal reflection. The light-emitting die may be a bare light-emitting diode die. The light-emitting die may include or consist essentially of a GaN-based semiconductor material (e.g., a material including GaN, AlN, and/or InN and/or combinations or alloys thereof). The semiconductor material may include In. The light-emitting die may emit blue and/or ultraviolet light.

In another aspect, embodiments of the invention feature a light-emitting device that includes or consists essentially of a light-emitting die having (i) a top face and a bottom face opposite the top face, the top and/or bottom face being configured for emission of light therefrom, and (ii) a sidewall spanning the top and bottom faces, and at least partially surrounding the light-emitting die, a phosphor element including or consisting essentially of (i) a binder and (ii) disposed within the binder, one or more wavelength-conversion materials for absorbing at least a portion of light emitted from the light-emitting die and emitting converted light having a different wavelength. The phosphor element has an outer contour having (i) a curved region that defines only a portion of a hemisphere having a hemisphere radius and (ii) a planar region disposed over the light-emitting die and substantially parallel to the top face of the light-emitting die.

Embodiments of the invention may include one or more of the following in any of a variety of different combinations. The bottom face of the light-emitting die may be substantially coplanar with a base of phosphor element opposite the planar region. The ratio of a z-offset of the planar region within the hemisphere to the hemisphere radius may be a value ranging from 0.02 to 0.15. The ratio of a z-offset of the planar region within the hemisphere to the hemisphere radius may be a value ranging from 0.04 to 0.12. The outer contour of the phosphor element may have a region defined by a cylindrical cutoff within the hemisphere. The ratio of a length of the cylindrical cutoff to the hemisphere radius may be a value ranging from 0.75 to 0.95. The length of the cylindrical cutoff may be a value ranging from 50 µm to 500 µm. The length of the cylindrical cutoff may be a value ranging from about 0.2 mm to about 20 mm. The hemisphere radius may be a value ranging from about 0.7 mm to about 5 mm. Light emitted from the light-emitting die may have a Lambertian distribution. The converted light may have an isotropic distribution. The converted light may combine with unconverted light emitted from the light-emitting die to form substantially white light.

The divergence of color temperature of the substantially white light emitted from the device may vary, over an angular range of 0° to 85°, no more than 0.01 in terms of $\Delta u'v'$ deviation from a spatially weighted averaged chromaticity. The divergence of color temperature of the substantially white light emitted from the device may vary, over an angular range of 0° to 85°, no more than 0.005 in terms of $\Delta u'v'$ deviation from a spatially weighted averaged chromaticity.

The one or more wavelength conversion materials may include or consist essentially of one or more phosphor particles. The phosphor particles each may include or consist essentially of garnet and a rare-earth element. The light-emitting device may include, disposed beneath (i) at least a portion of the light-emitting die and/or (ii) the phosphor element, a mounting surface reflective to converted light and/or unconverted light emitted by the light-emitting die. The mounting surface may have a reflectivity to visible light of approximately 95% to approximately 98%. At least a portion of the outer contour of the phosphor element may have a surface texture for reducing total internal reflection. The light-emitting die may be a bare light-emitting diode die. The light-emitting die may include or consist essentially of a GaN-based semiconductor material. The semiconductor material may include In. The light-emitting die may emit blue and/or ultraviolet light.

In yet another embodiment, aspects of the invention feature a light-emitting device that includes or consists essentially of a light-emitting die having (i) a top face and a bottom face opposite the top face, the top and/or bottom face being configured for emission of light therefrom, and (ii) a sidewall spanning the top and bottom faces, and at least partially surrounding the light-emitting die, a phosphor element including or consisting essentially of (i) a binder and (ii) disposed within the binder, one or more wavelength-conversion materials for absorbing at least a portion of light emitted from the light-emitting die and emitting converted light having a different wavelength, converted light and unconverted light emitted by the light-emitting die combining to form substantially white light. The phosphor element includes or consists essentially of (i) a first region having a sidewall substantially parallel to the sidewall of the light-emitting die and (ii) disposed over the first region, a second region having a top surface defining a portion of an oblate ellipsoid.

Embodiments of the invention may include one or more of the following in any of a variety of different combinations. The second region may define a portion of an oblate ellipsoid described by the equation $$z(r) = \frac{r^2}{R\left(1 + \sqrt{1 - (1+K)(r^2/R^2)}\right)},$$

where z is a height of the second region above a top surface of the light-emitting die, r is a radius of the oblate ellipsoid, R is approximately 2.38, and K is approximately 6.0. The first region of the phosphor element may be discrete from and optically bonded to the second region of the phosphor element. The second region of the phosphor element may be disposed over the top surface of the light-emitting die. A reflective surface may be disposed below the bottom surface of the light-emitting die. The distance between the sidewall of the first region and the sidewall of the light-emitting die may be a value ranging from 0.2 mm to 20 mm. The distance between the sidewall of the first region and the sidewall of the light-emitting die may be a value ranging from 0.4 mm to 5 mm. Light emitted from the light-emitting die may have a Lambertian distribution. The converted light may have an isotropic distribution. The divergence of color temperature of the substantially white light emitted from the device may vary, over an angular range of 0° to 85°, no more than 0.01 in terms of Δu'v' deviation from a spatially weighted averaged chromaticity. The divergence of color temperature of the substantially white light emitted from the device may vary, over an angular range of 0° to 85°, no more than 0.005 in terms of Δu'v' deviation from a spatially weighted averaged chromaticity.

The one or more wavelength conversion materials may include or consist essentially of one or more phosphor particles. The phosphor particles may each include or consist essentially of garnet and a rare-earth element. The light-emitting device may include, disposed beneath (i) at least a portion of the light-emitting die and/or (ii) the phosphor element, a mounting surface reflective to converted light and/or unconverted light emitted by the light-emitting die. The mounting surface may have a reflectivity to visible light of approximately 95% to approximately 98%. The top surface of the second region of the phosphor element may have a surface texture for reducing total internal reflection. The light-emitting die may be a bare light-emitting diode die. The light-emitting die may include or consist essentially of a GaN-based semiconductor material. The semiconductor material may include In. The light-emitting die may emit blue and/or ultraviolet light.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the terms "substantially," "approximately," and "about" mean ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Various embodiments of the present invention engineer (1) the angular intensity distribution of the light emitted from the LEE as it exits the surrounding phosphor and (2) the angular intensity distribution of light emitted from the phosphor to achieve a desired angular characteristic of one or more optical parameters, for example to achieve a relatively uniform color temperature with viewing angle. For example if the light from the two sources, for example blue from an LEE and yellow from a phosphor, are engineered to have the same or substantially the same angular intensity distribution, then the combination, when viewed or projected externally to the phosphor, has the same or substantially the same chromaticity as a function of angle. Thus, preferred embodiments of the invention control the angular intensity distribution of the light emitted from the LEE and the light-conversion material as it exits the surrounding phosphor. Various optical processes occur within the phosphor (for example absorption and scattering) and at the phosphor/air interface (for example TIR and refraction) that modify the LEE angular intensity distribution from what it would be in the absence of an associated phosphor, and embodiments of the invention account for such processes, as will be detailed herein.

Figure 1A:
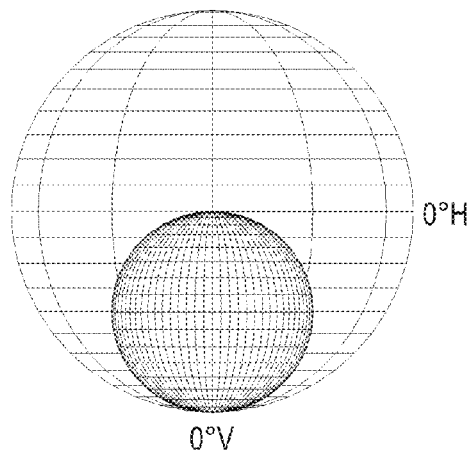
FIGS. 1A and 1B are plots of the simulated spectral radiant intensity distribution of blue and yellow light, respectively, emitted from a light-emitting element and phosphor particles.
Figure 1B:
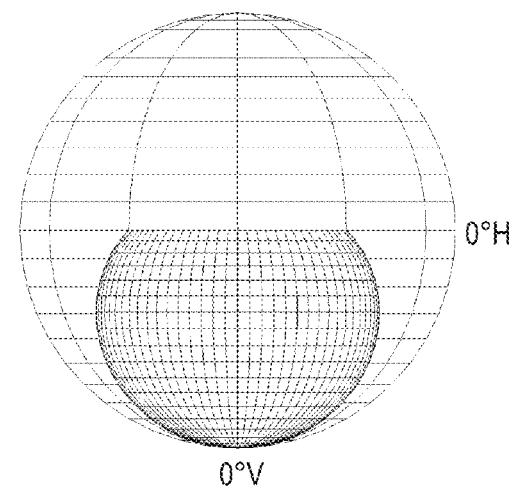
Figure 2:
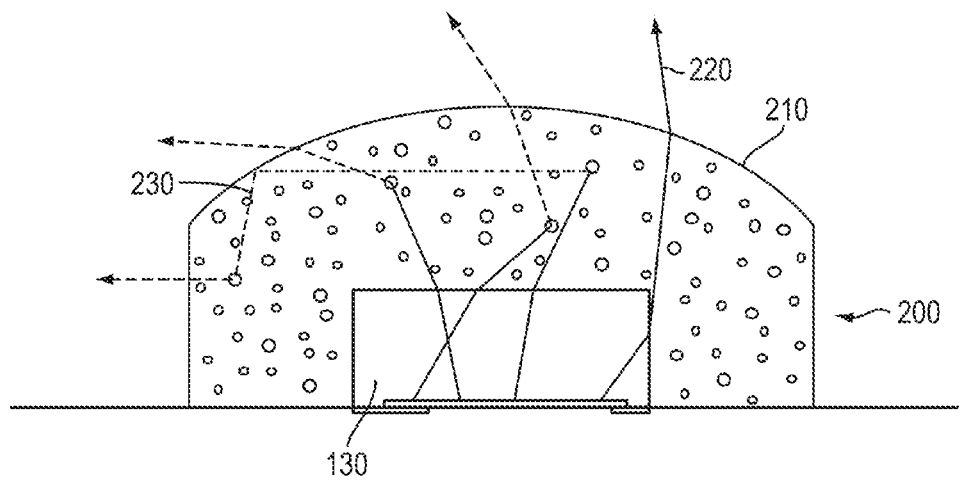
FIG. 2 is a schematic cross-section of a light-emitting device in accordance with various embodiments of the invention, illustrating refraction and total internal reflection of light.

In one embodiment of the present invention, a combination of refraction from the top surface of the phosphor element and TIR from the interface between the phosphor element and the surrounding air are used to preferentially redirect both (i) the light from the LEE that is not absorbed by the phosphor particles and (ii) the light emitted by the phosphor particles in specific directions to achieve one or more desired angularly dependent optical characteristics. In other words, the phosphor element is used not only to mechanically support the phosphor around a portion of the LEE, but it is also used as a lens structure that is optically coupled to the LEE and uses both TIR and refraction to redirect the pump light (e.g., blue light from the LEE) within the lens structure such that the chromaticity of the emitted light (e.g., white light, being a combination of the blue pump light and the phosphor emissions) does not appreciably vary with the angle of emission. FIG. 2 is a schematic of an exemplary system 200 of the present invention featuring an LEE 130 and that utilizes both refraction (to produce, for example, light 220) and TIR (to produce, for example, light 230) from the surface of a phosphor element 210.

Figure 3A:
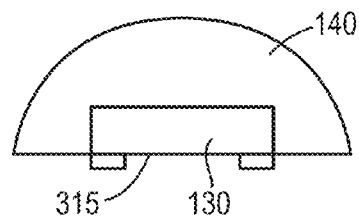
FIGS. 3A, 3B, and 4A are schematic cross-sections of light-emitting devices having shaped phosphor elements in accordance with various embodiments of the invention.
Figure 3B:
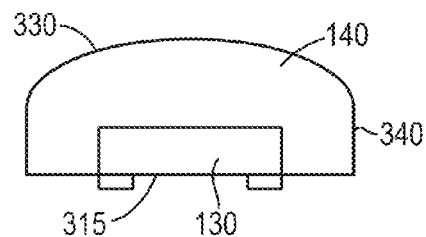

FIGS. 3A and 3B depict two embodiments of the present invention, each featuring a LEE 130 over which is disposed a phosphor element 140. In FIG. 3A, phosphor element 140 has a single-curve shape, i.e., a smooth curve with no intermediate discontinuities. FIG. 3B shows another example of phosphor element 140 having a two-curve shape, where the two portions are identified as portions 330 and 340. In this case, portion 340 is perpendicular to the bottom surface 315 of LEE 130; however, this is not a limitation of the present invention, and in other embodiments portion 340 may form an acute or obtuse angle with the bottom surface of LEE 130. Various embodiments of this invention control the shape of phosphor element 140, and in particular the shape of surfaces 330 and/or 340. While FIGS. 3A and 3B show phosphor element 140 having one and two surface curvatures respectively, this is not a limitation of the present invention, and in other embodiments phosphor element 140 may have more than two such curvatures. As discussed herein, the shape and size of phosphor element 140 is an important aspect of embodiments of the present invention.

Various factors, such as the dimensions of LEE die, mirrored active area, phosphor matrix, phosphor particle concentration, and/or the diffuse and specular reflection properties of the LEE substrate, may significantly affect the TIR and refraction of both blue and yellow (for example) light within the phosphor matrix. In general, numerical simulation may be utilized to determine optimal shapes of the top surface for given sets of design parameters. As detailed herein, TIR and refraction may be used to redirect the light.

Example 1

Figure 4A:
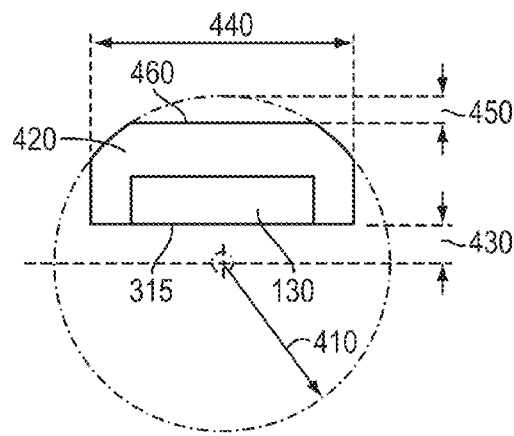
Figure 4B:
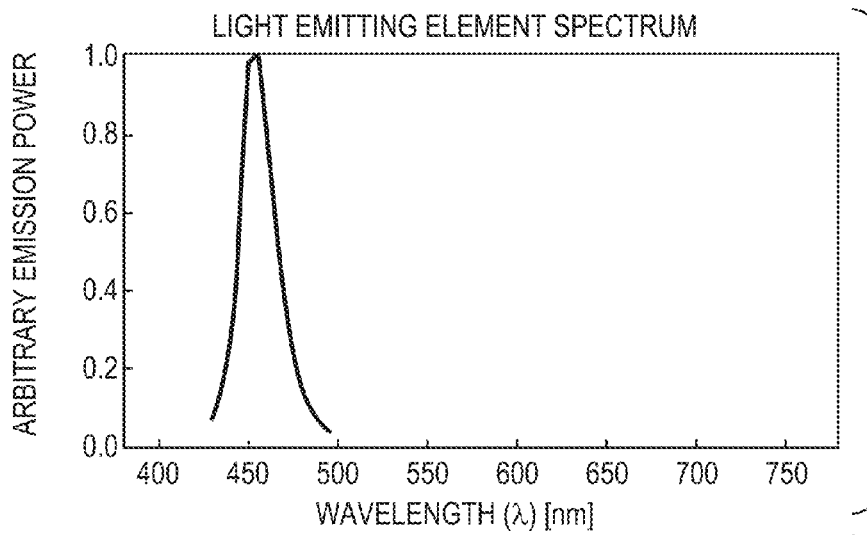
FIGS. 4B-4D are, respectively, plots of the lighting-device emission spectrum, phosphor-transmission spectrum, and phosphor-emission spectrum for the lighting-devices of FIG. 4A.
Figure 4C:
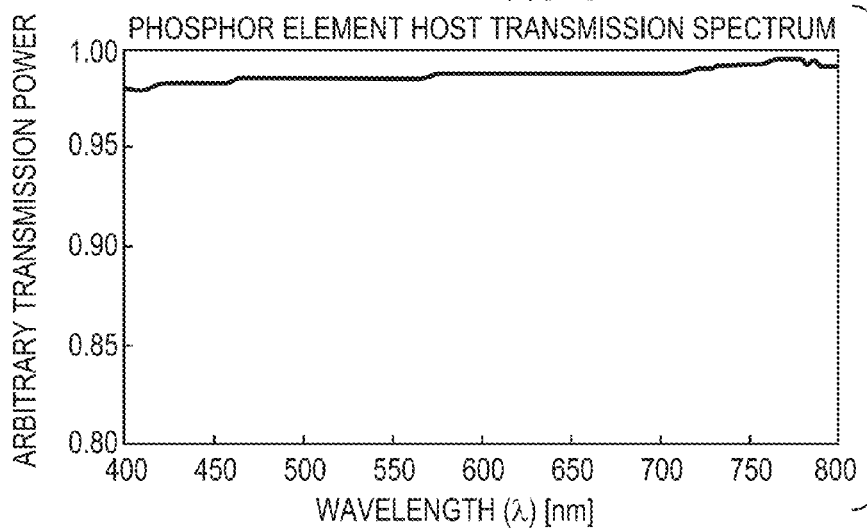
Figure 4D:
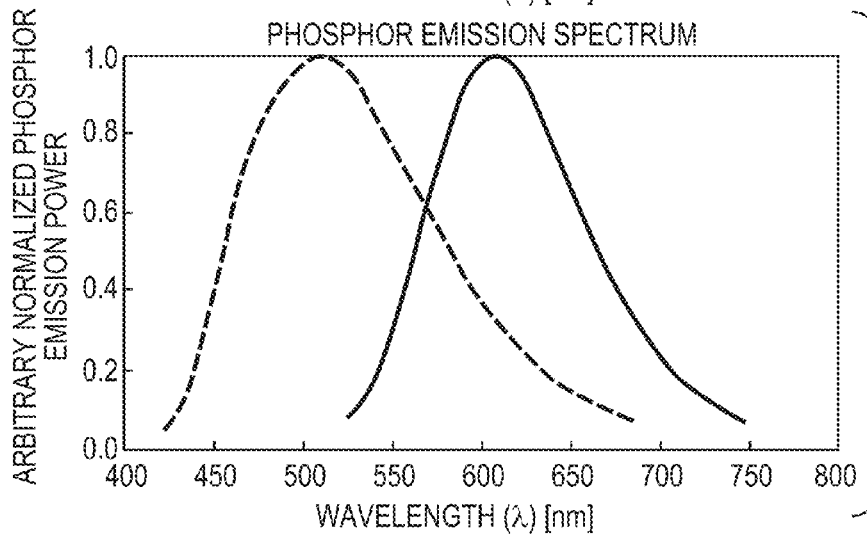
Figure 4E:
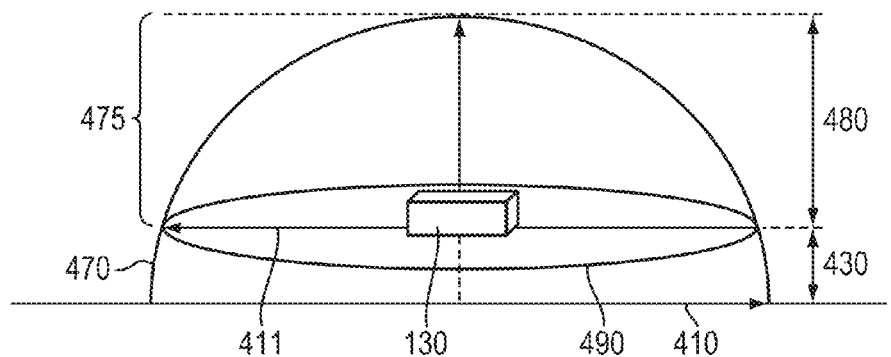
FIG. 4E is a schematic cross-section of a light-emitting device having a shaped phosphor element in accordance with various embodiments of the invention.

FIG. 4A shows a schematic of one class of embodiments of the present invention, including or consisting essentially of LEE 130 partially surrounded by a phosphor element 420. In this example LEE 130 is a blue LEE, for example a blue LED, having an emission spectrum as shown in FIG. 4B. LEE 130 has a length of about 324 µm, a width of about 200 µm, and a height of about 134 µm. In these simulations the phosphor element 420 is a hemispherical shape having a radius 410 of about 1 mm. Phosphor element 420 has a refractive index of about 1.53 while LEE 130 has a refractive index of about 1.74. These simulations are optimized to produce white light with a CCT of about 3500K and a color point on the 1931 CIE chromaticity diagram of about 0.4 chromaticity x value and at about 0.4 chromaticity y value using two phosphors, the emission spectra of which are shown in FIG. 4D. The combined mean-free-path of phosphor element 420 is about 137 µm between simulation events (absorption, scattering, etc.); the phosphor transmission spectrum is shown in FIG. 4C. Phosphor element 420 is defined as a function of a hemispherical profile with a radius 410. FIG. 4A also shows additional optional features of phosphor element 420, including a centroid z-offset 430, a cylindrical cut-off having diameter 440 that in some embodiments results in a second portion of the shape of phosphor 140, for example portion 340 shown in FIG. 3B, and a flat-top z-offset 450 that results in a flat top 460 having a flat top radius (not identified in FIG. 4A). Any one or all of these features may be combined in phosphor element 420. The structure of FIG. 4A may also be described as a hemispherical cap, that is a portion of a hemisphere cut off by a plane above the base of the hemisphere, as shown in FIG. 4E (for reference a hemispherical cap with a centroid z-offset of zero (0) is a hemisphere). FIG. 4E shows hemisphere 470 having a radius 410 and hemispherical cap 475 with LEE 130 sitting on the plane forming the base 490 of hemispherical cap 475. The hemispherical cap height is identified as 480, the centroid z-offset is identified as 430, and the hemispherical cap radius is identified as 411. The structure in FIG. 4E does not show optional flat top 460 or the cylindrical cut-off shown in FIG. 4A.

Figure 5A:
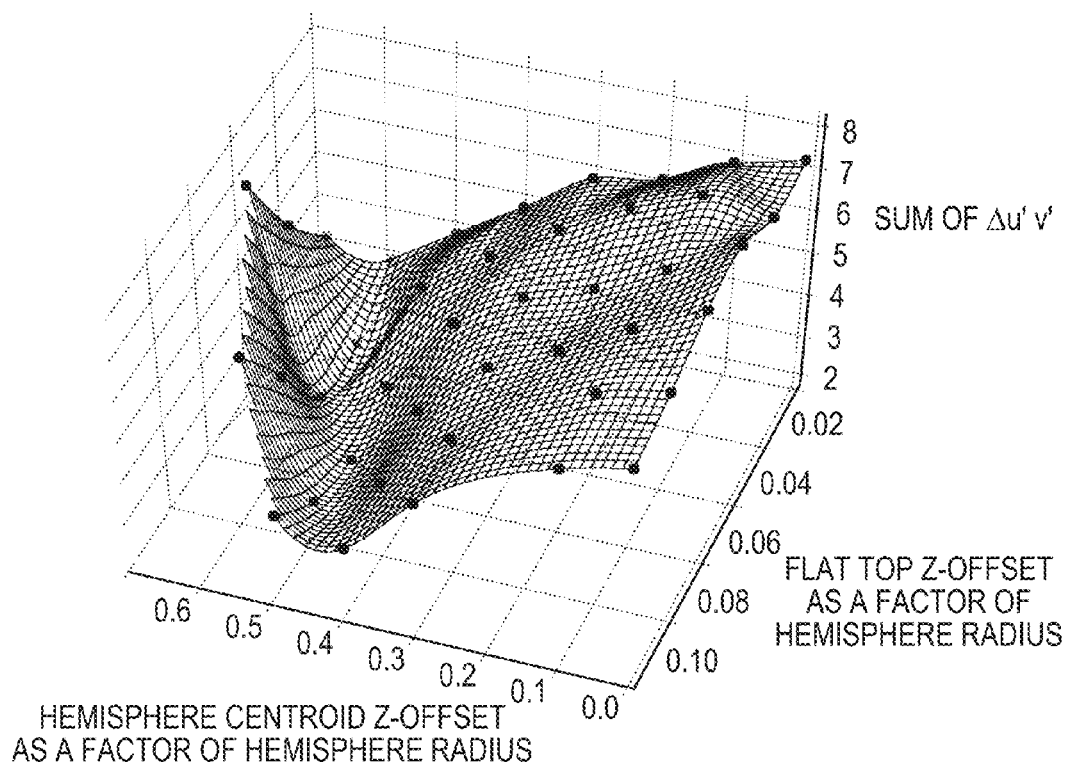
FIGS. 5A and 5B are plots of simulated chromaticity uniformity for a light-emitting device according to FIG. 4A.
Figure 5B:
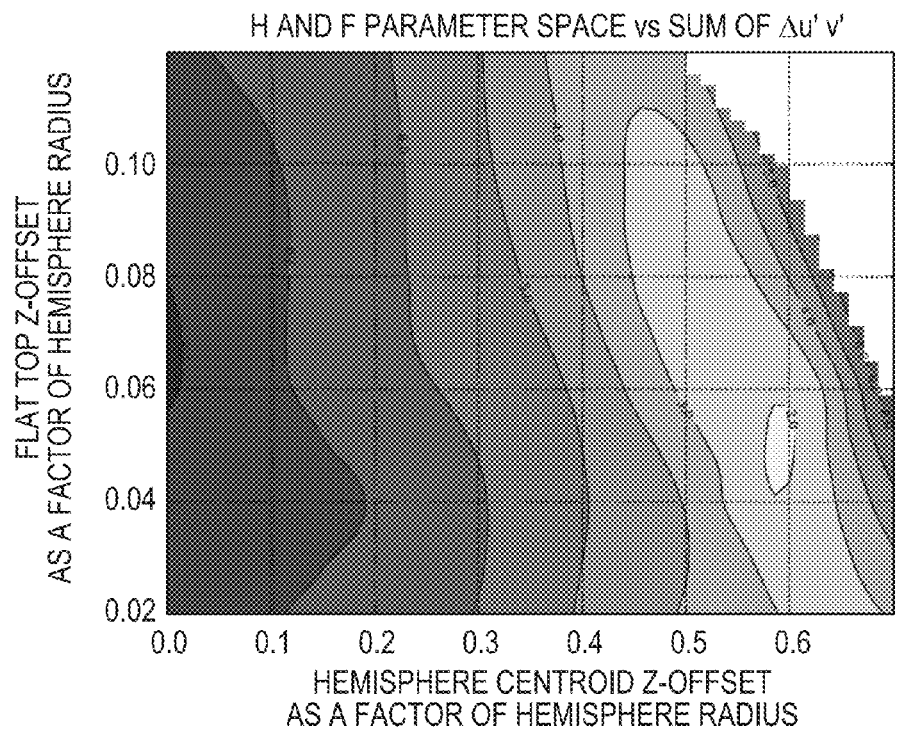
Figure 5C:
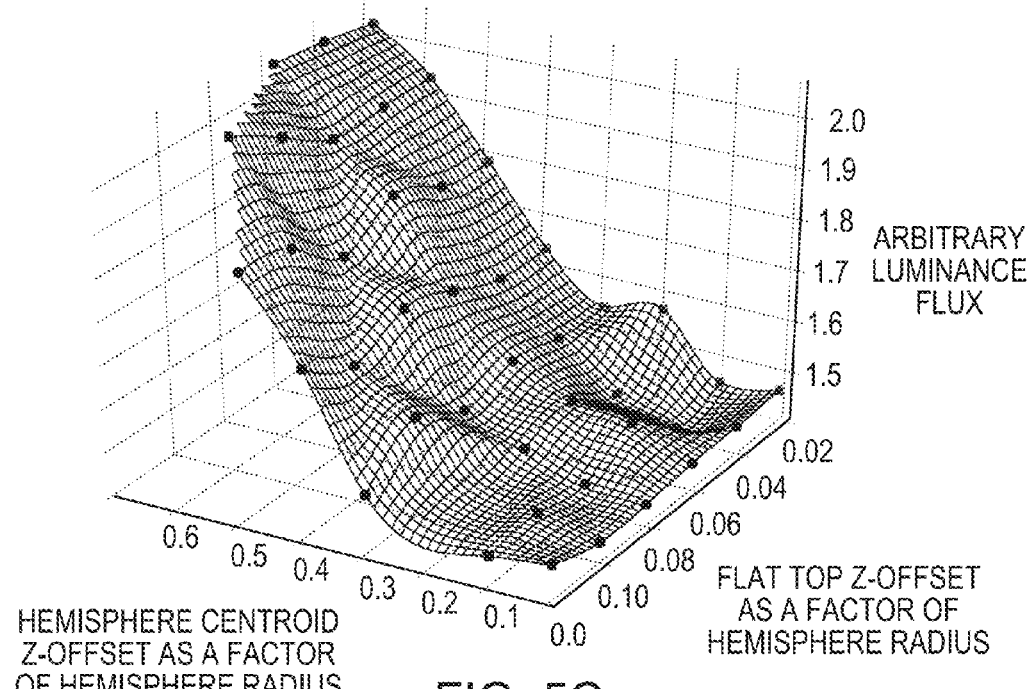
FIG. 5C is a plot of simulated luminance flux for a light-emitting device according to FIG. 4A.

FIGS. 5A and 5B show the chromaticity uniformity while FIG. 5C shows the luminous flux for the structure of FIG. 4A, as a function of centroid z-offset 430 and flat top z-offset 450. FIGS. 5A and 5B show the same data but from different orientations. FIG. 5B also shows a contour plot of chromaticity uniformity. In FIGS. 5A-5C both centroid z-offset and flat top z-offset values are normalized to the hemisphere radius 410. Chromaticity uniformity (sum of $\Delta$ u' v') is measured as the sum of the deviation of u'v' from the spatially averaged chromaticity coordinate over 0° to 90° polar angles as defined in IES LM-79-08, "Electrical and Photometric Measurements of Solid-State Lighting Products," Illuminating Engineering Society, January 2008 (where 0° is perpendicular to the emitting face of LEE 410), the entire disclosure of which is incorporated by reference herein.

As may be seen in FIGS. 5A and 5B, there is an unexpected minimum in the angular chromaticity uniformity for centroid z-offset values in the range of about 0.3 to about 0.7. Thus, instead of positioning LEE 130 at the base or equator of the hemisphere, as is conventionally done, a significant improvement in chromaticity uniformity may be realized by positioning LEE 130 above the base or equator of the hemisphere. As may be seen from FIGS. 5A and 5B, the uniformity relative to an LEE 130 at the base or equator of the hemisphere may improve by over a factor of three. FIG. 5C shows that the luminance flux increases essentially monotonically with an increase in the centroid z-offset. As may be seen from FIGS. 5A-5C, the flat top z-offset has a relatively smaller impact on chromaticity uniformity and luminance flux. However, as will be discussed herein, there may be other reasons for incorporating a flat top, and FIGS. 5A-5C show that incorporation of a flat top has relatively little impact on the chromaticity uniformity and luminance flux.

Figure 6A:
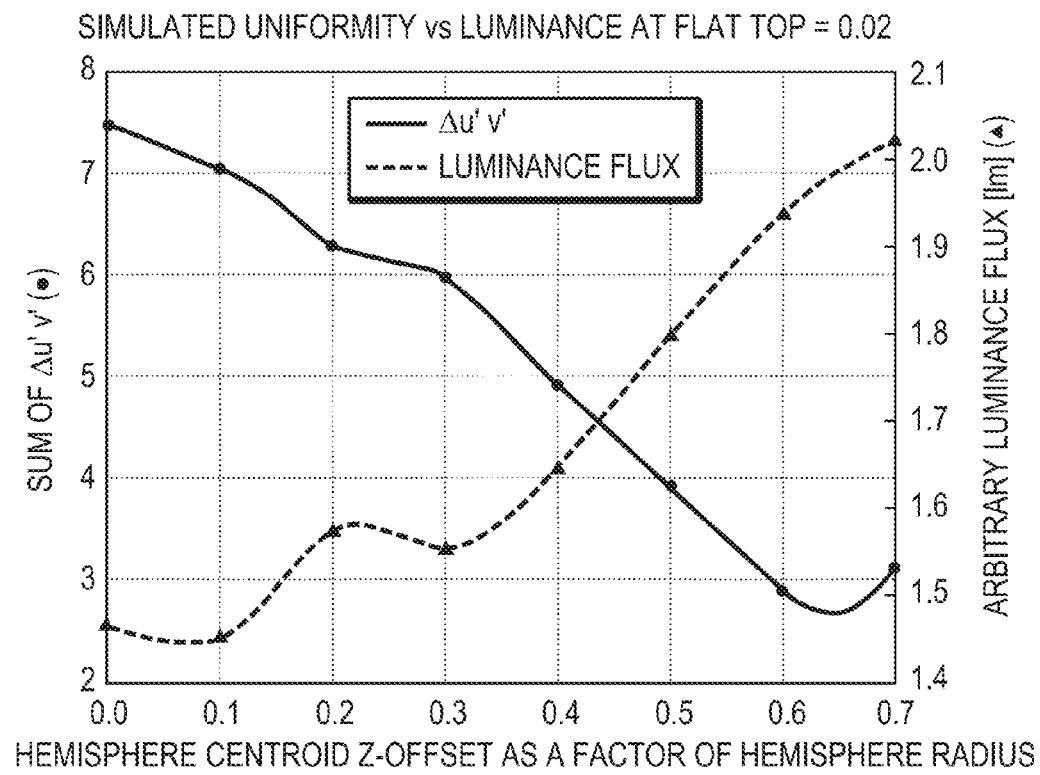
FIGS. 6A and 6B are plots of simulated chromaticity uniformity and luminance flux for a light-emitting device according to FIG. 4A.
Figure 6B:
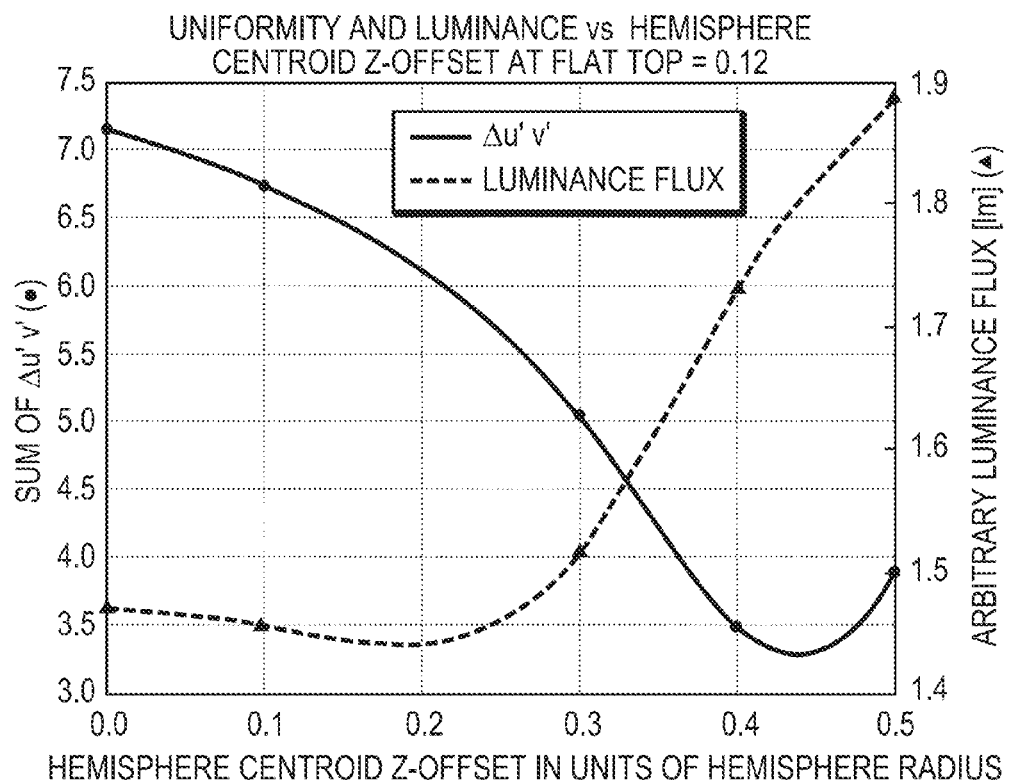

FIGS. 6A and 6B show plots of chromaticity uniformity and luminance flux as a function of centroid z-offset at two flat top z-offset values, about 0.02 and about 0.12 respectively. In FIGS. 6A and 6B, both centroid z-offset and flat top z-offset values are normalized to radius 410. As may be seen there is a clear minimum in chromaticity uniformity (or chromaticity deviation) in the range of centroid z-offset from about 0.3 to about 0.7. As the flat-top z-offset value increases, the amount of centroid z-offset required to minimize the chromaticity variation decreases. For a flat top z-offset of about 0.02 (almost a hemisphere), the optimal centroid z-offset is in the range of about 0.57 to about 0.7, or in the range of about 0.6 to about 0.675. For a larger flat top z-offset of about 0.12, the optimal centroid z-offset is in the range of about 0.375 to about 0.5, or in the range of about 0.4 to about 0.475.

As may be seen from FIGS. 6A and 6B, the luminance flux increases substantially monotonically with increasing centroid z-offset. In some embodiments, luminance flux intensity may be relatively more important than angular chromaticity uniformity, and in these embodiments a larger centroid z-offset value may be chosen to increase luminance flux intensity while still maintaining relatively high angular chromaticity uniformity. For example, for the embodiment where the flat top z-offset is about 0.02, the centroid z-offset may be in the range of about 0.65 to about 0.7. For the embodiment where the flat-top z-offset is about 0.12, the centroid z-offset may be in the range of about 0.45 to about 0.5. As may be seen, there is a relatively substantial overlap between the values of centroid z-offset to achieve minimum angular chromaticity variation and to achieve high luminous flux.

Figure 6C:
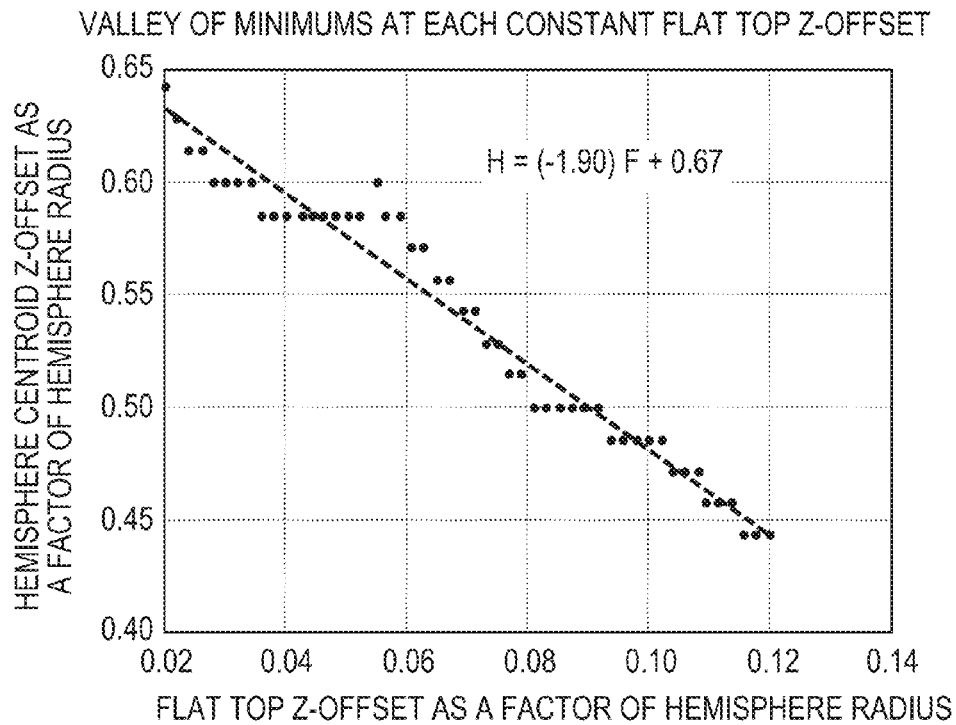
FIGS. 6C and 6D are plots showing design guidelines for a light-emitting device according to FIG. 4A.

FIG. 6C shows a plot of centroid z-offset (normalized to hemisphere radius 410) as a function of flat top z-offset (normalized to hemisphere radius 410) to achieve minimum angular chromaticity variation. In some embodiments, FIG. 6C may be used as a design guide to achieve minimum angular chromaticity variation. First the desired flat top z-offset is determined, then FIG. 6C is used to determine the optimal centroid z-offset to achieve minimum angular chromaticity variation. A line fitted to the data gives a relationship of $H=-1.90\times F+0.67$, where F is the flat top z-offset and H is the centroid z-offset. As may be seen from FIGS. 5A and 5B, there is relatively little variation in angular chromaticity non-uniformity as a function of flat top z-offset, when a preferred value for centroid z-offset is chosen.

Figure 6D:
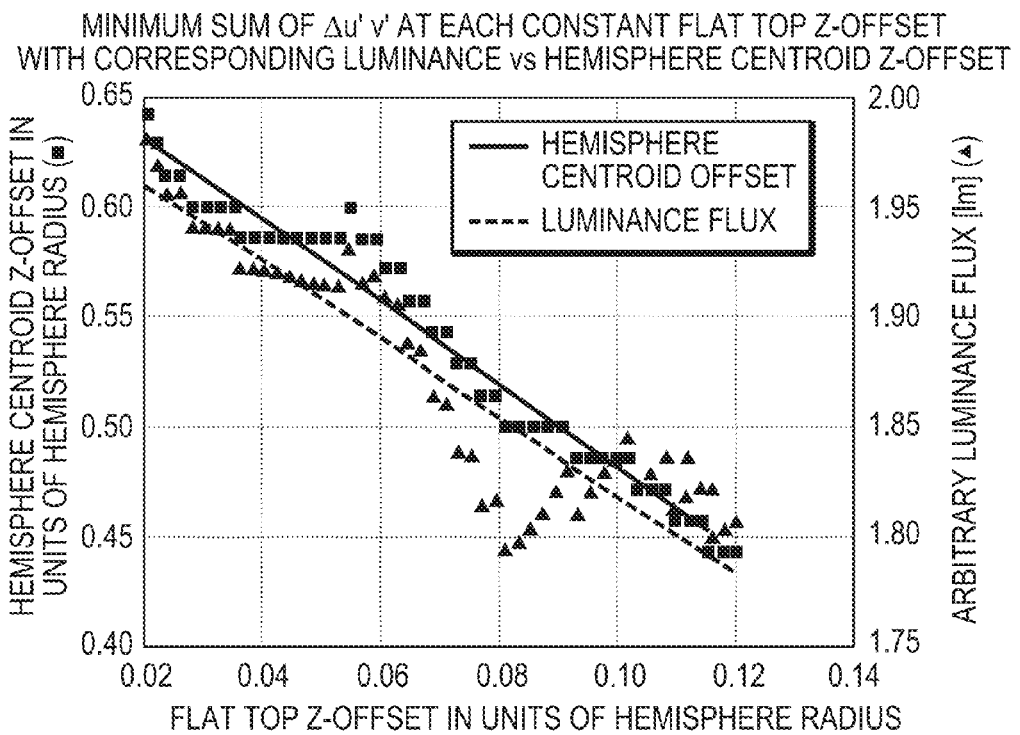

FIG. 6D shows the same data as FIG. 6C, but with the addition of luminance flux. The luminance flux data shown in FIG. 6C is the value at the minimum angular chromaticity non-uniformity for each value of flat top z-offset. As may be seen from FIG. 6D, smaller flat top z-offset values give a relatively larger luminance flux, but the total variation in luminance flux in FIG. 6D is relatively small, on the order of about 10%.

Figure 7A:
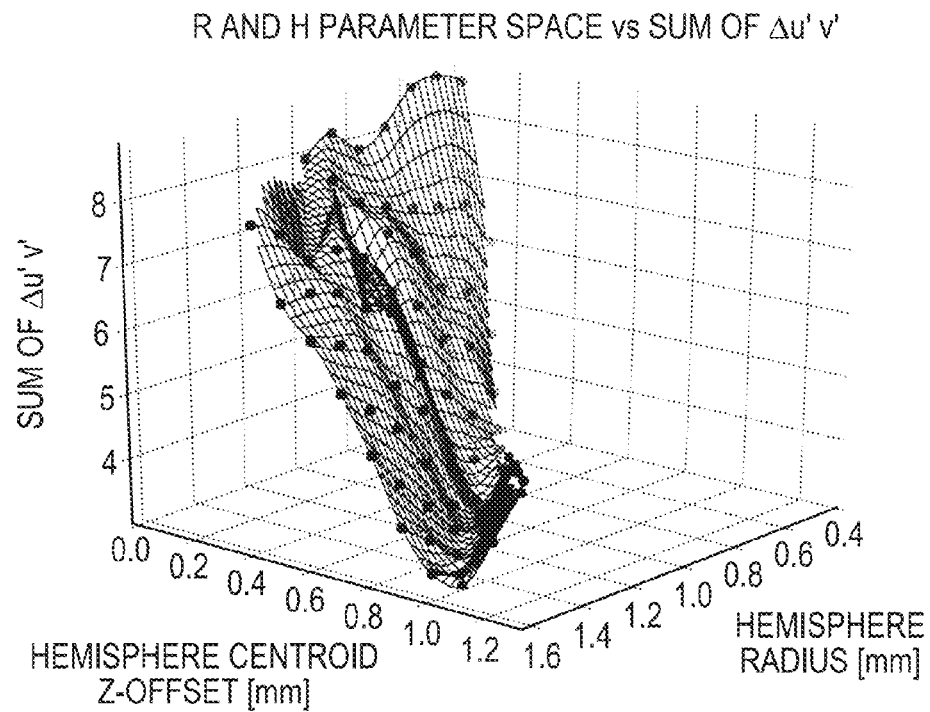
FIGS. 7A and 7B are plots of simulated chromaticity uniformity for a light-emitting device according to FIG. 4A.
Figure 7B:
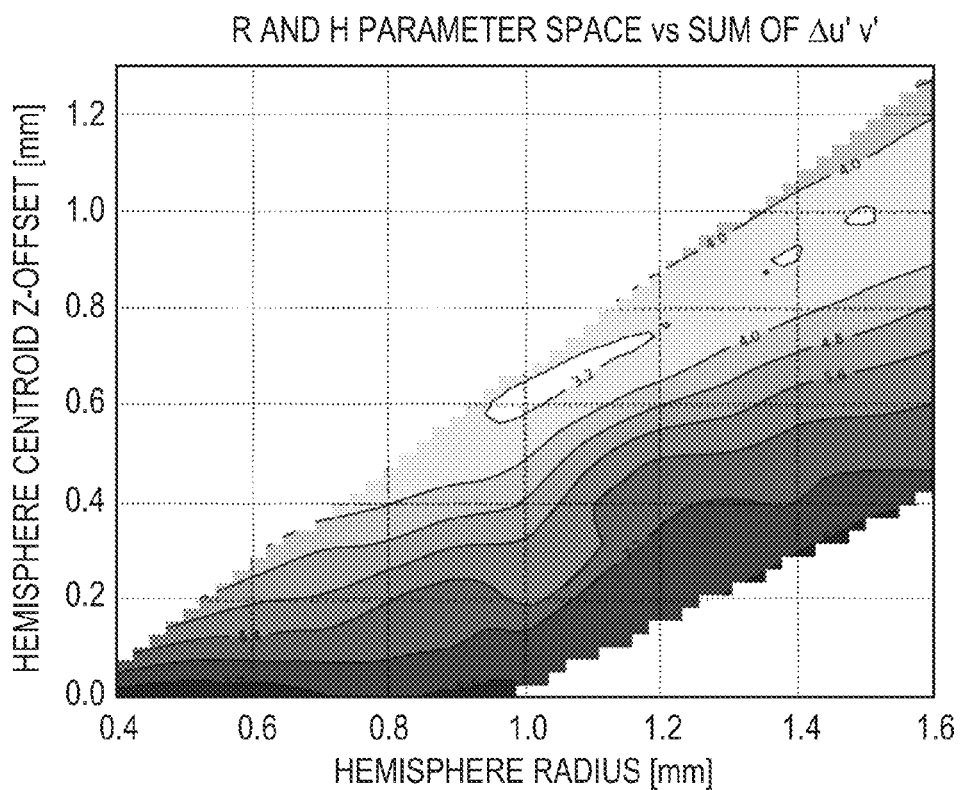
Figure 7C:
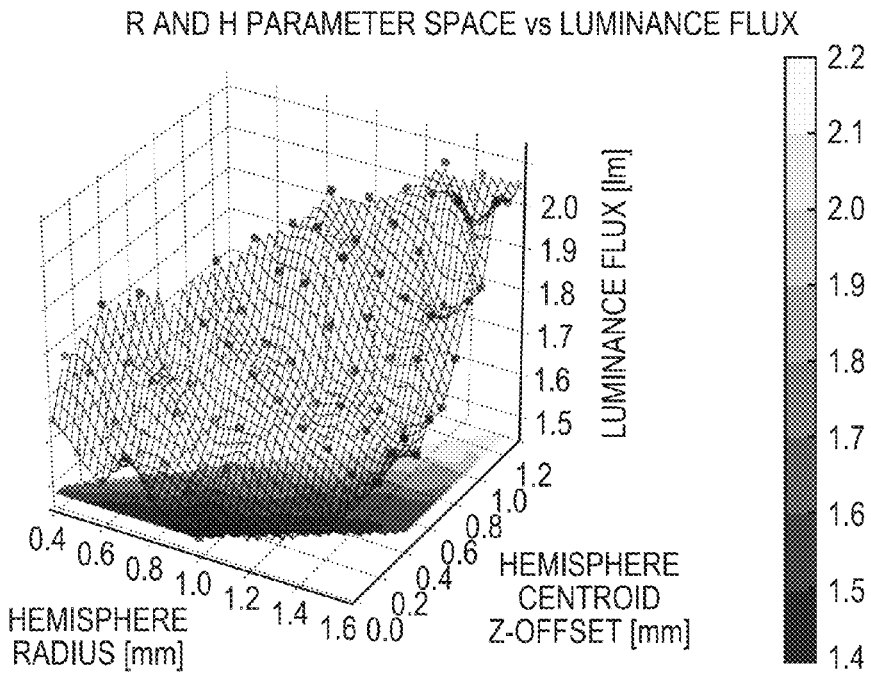
FIG. 7C is a plot of simulated luminance flux for a light-emitting device according to FIG. 4A.

FIGS. 7A-7C show angular chromaticity uniformity and luminance flux as a function of centroid z-offset and hemisphere radius, respectively. In this example, the flat top z-offset is zero and the hemisphere radius is varied from 0.4 to 1.6 mm. The size of LEE 130 and other simulation parameters are the same as for FIGS. 5A-5C and FIGS. 6A-6C. As may be seen from FIGS. 7A and 7B, varying the hemisphere radius does not change the unexpected result that the angular chromaticity uniformity is minimized with a relatively large centroid z-offset. There is a slight improvement in angular chromaticity uniformity with increasing hemisphere radius, but as will be seen in connection with FIGS. 8A and 8B, this is relatively small. Similar to the plot of FIG. 6C, the plot in FIG. 7C shows that the luminance flux increases with increasing centroid z-offset and also increases with increasing hemisphere radius.

Figure 8A:
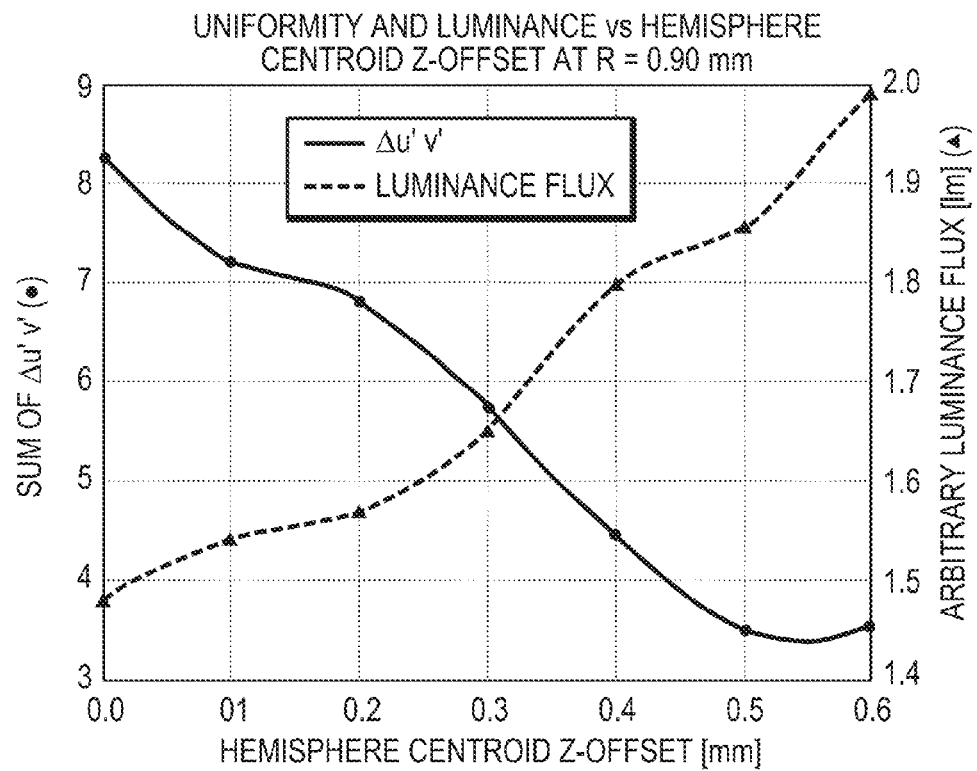
FIGS. 8A and 8B are plots of simulated chromaticity uniformity and luminance flux for a light-emitting device according to FIG. 4A.
Figure 8B:
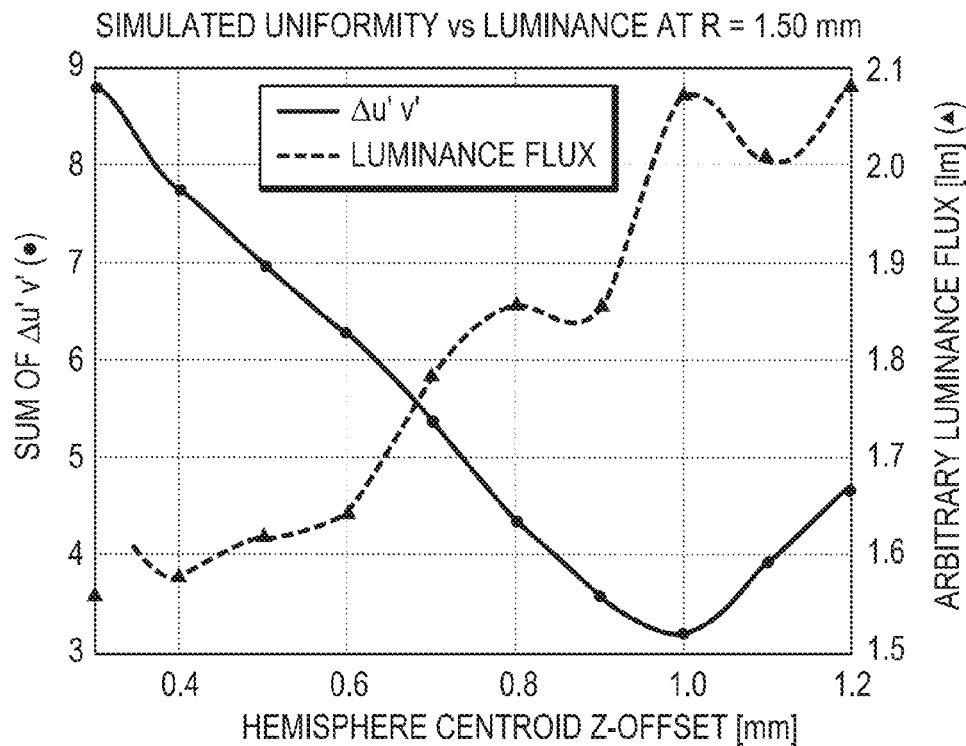

FIGS. 8A and 8B show plots of chromaticity uniformity and luminance flux as a function of centroid z-offset at two hemisphere radius values, about 0.90 mm and about 1.5 mm respectively. As may be seen there is a minimum in angular chromaticity uniformity for higher values. In comparison to FIGS. 6A and 6B, there is a relatively stronger correlation between the centroid z-offset position for minimum angular chromaticity uniformity and hemisphere radius, than for centroid z-offset position and flat top z-offset. As the hemisphere radius increases, the required value of centroid z-offset to minimize chromaticity variation increases. For a hemisphere radius of about 0.90 mm, the optimal centroid z-offset is in the range of about 0.5 mm to about 0.6 mm, or in the range of about 0.525 mm to about 0.575 mm. If these values are normalized to the hemisphere radius, then the ranges are about 0.55 to about 0.67 and about 0.58 to about 0.64. For a hemisphere radius of about 1.5 mm, the optimal centroid z-offset is in the range of about 0.8 mm to about 1.15 mm, or in the range of about 0.9 mm to about 1.1 mm. If these values are normalized to the hemisphere radius, then the ranges are about 0.53 to about 0.77 and about 0.60 to about 0.73.

As may be seen from FIGS. 8A and 8B, the luminance flux increases substantially monotonically with increasing centroid z-offset. In some embodiments, luminance flux intensity may be relatively more important than angular chromaticity uniformity, and in these embodiments a larger centroid z-offset value may be chosen to increase luminance flux intensity while still maintaining relatively high angular chromaticity uniformity. For example, for an embodiment in which the hemisphere radius is about 0.9 mm, the centroid z-offset may be in the range of about 0.5 to about 0.6. As may be seen from FIG. 8A, the region of centroid z-offset to achieve high luminance flux and reduced angular chromaticity exhibit substantial overlap. For the embodiment where the flat-top z-offset is about 0.90, the centroid z-offset may be in the range of about 0.5 to about 0.6.

Figure 8C:
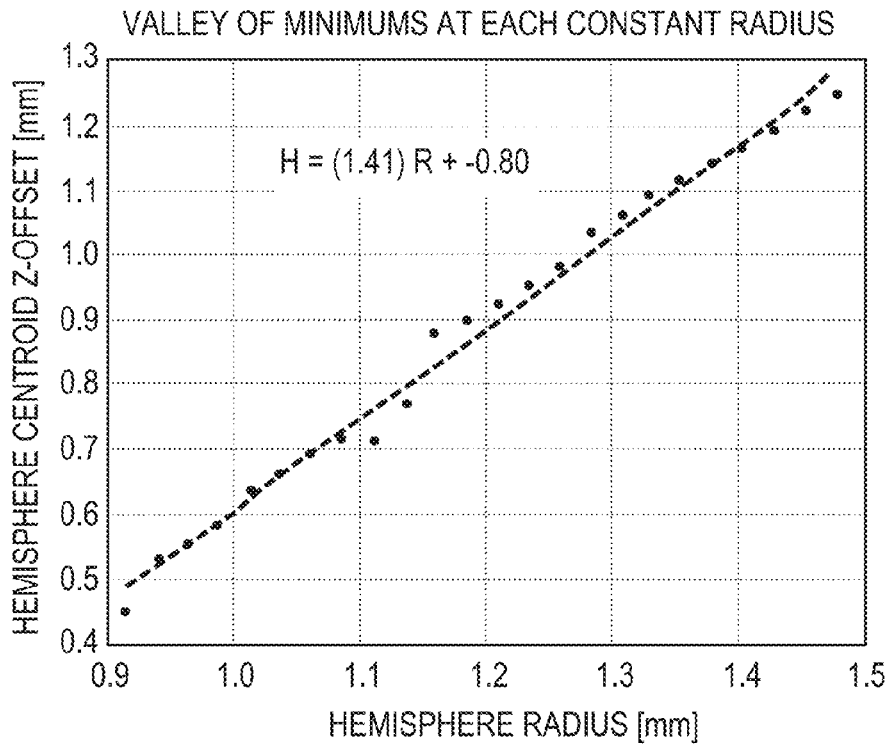
FIGS. 8C and 8D are plots showing design guidelines a light-emitting device according to FIG. 4A.

FIG. 8C shows a plot of centroid z-offset as a function of hemisphere radius to achieve minimum angular chromaticity variation. In some embodiments, FIG. 8C may be used as a design guide to achieve minimum angular chromaticity variation. First, the desired hemisphere radius is determined, then FIG. 8C may be used to determine the optimal centroid z-offset to achieve minimum angular chromaticity variation. A line fitted to the data gives a relationship of H=−1.41×R−0.80, where R is the hemisphere radius and H is the centroid z-offset.

Figure 8D:
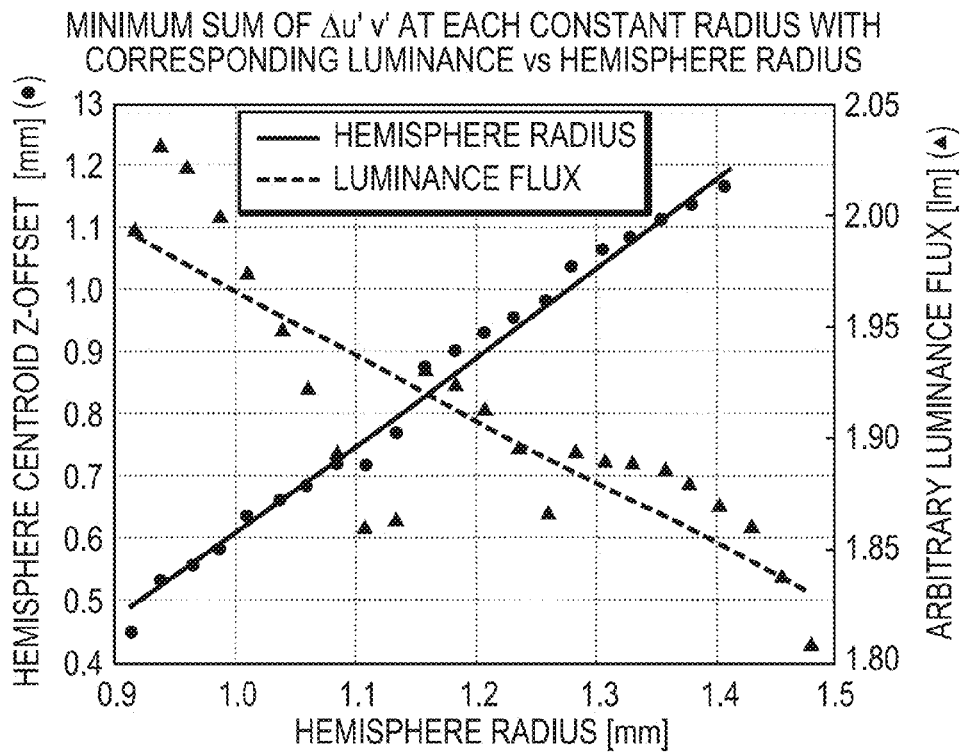

FIG. 8D shows the same data as FIG. 8C, but with the addition of luminance flux. The luminance flux data shown in FIG. 8C is the value at the minimum angular chromaticity non-uniformity for each value of hemisphere radius. As may be seen from FIG. 8D, smaller hemisphere radius values give a relatively larger luminance flux, but the total variation in luminance flux in FIG. 8D is relatively small, on the order of about 10%.

The structural parameters associated with the minimum angular chromaticity variation region from FIG. 5B are a radius in the range of about 0.9 mm to about 1.1 mm and a centroid z-offset of about 0.5 mm to about 0.7 mm, and more particularly a radius of about 0.93 mm to about 1 mm and a centroid z-offset of about 0.55 mm to about 0.65 mm. In one embodiment, the hemisphere has a radius in the range of about 0.6 mm to about 1.2 mm and a centroid z-offset value (normalized to the hemisphere radius) in the range of about 0.5 to about 0.8. In one embodiment, the hemisphere has a radius in the range of about 0.8 mm to 1.2 mm and a centroid z-offset value (normalized to the hemisphere radius) in the range of about 0.4 to about 0.8 and a flat top z-offset (normalized to hemisphere radius) in the range of about 0.02 to 0.15. In one embodiment, the hemispherical cap radius is about 0.6 mm to about 1.0 mm, height 480 is in the range of about 0.15 mm to about 0.5 mm, and the flat top radius is in the range of about 0.15 to about 0.45 mm. In one embodiment, the hemispherical cap radius is about 0.6 mm to about 1.0 mm, the centroid offset is about 0.5 mm to about 0.6 mm, and the flat top z-offset is about 0.02 mm to about 0.08 mm. In one embodiment, the hemispherical cap radius is about 0.96 mm, the centroid offset is about 0.54 mm, and the flat top z-offset is about 0.05 mm. In some embodiments, the hemispherical cap has a base radius of about 0.5 mm to about 1.0 mm; however, this is not a limitation of the present invention, and in other embodiments the base of hemispherical cap may have a larger or smaller base radius. In some embodiments, the diameter of the flat top is in the range of about 50 µm to about 1000 µm; however, this is not a limitation of the present invention, and in other embodiments the flat top may have a larger or smaller diameter. In some embodiments, the diameter of the flat top is in the range of about 200 µm to about 800 µm. In some embodiments, the centroid z-offset is in the range of about 25 µm to about 300 µm; however, this is not a limitation of the present invention, and in other embodiments the centroid z-offset may be larger or smaller. In some embodiments, the centroid z-offset is in the range of about 50 µm to about 150 µm. In some embodiments, the hemisphere radius is in the range of about 100 µm to about 20 mm; however, this is not a limitation of the present invention, and in other embodiments the hemisphere radius may be larger or smaller.

While the discussion with respect to the structures shown herein have identified a hemisphere radius in the range of about 0.4 mm to about 1.6 mm, this is not a limitation of the present invention, and in other embodiments hemisphere radius may be smaller or larger. For example, in some embodiments the hemisphere radius may be 2 mm in diameter or 5 mm in diameter or larger. In some embodiments, the hemisphere radius may be smaller than 0.4 mm, for example 0.2 mm or smaller.

Example 2

Figure 9:
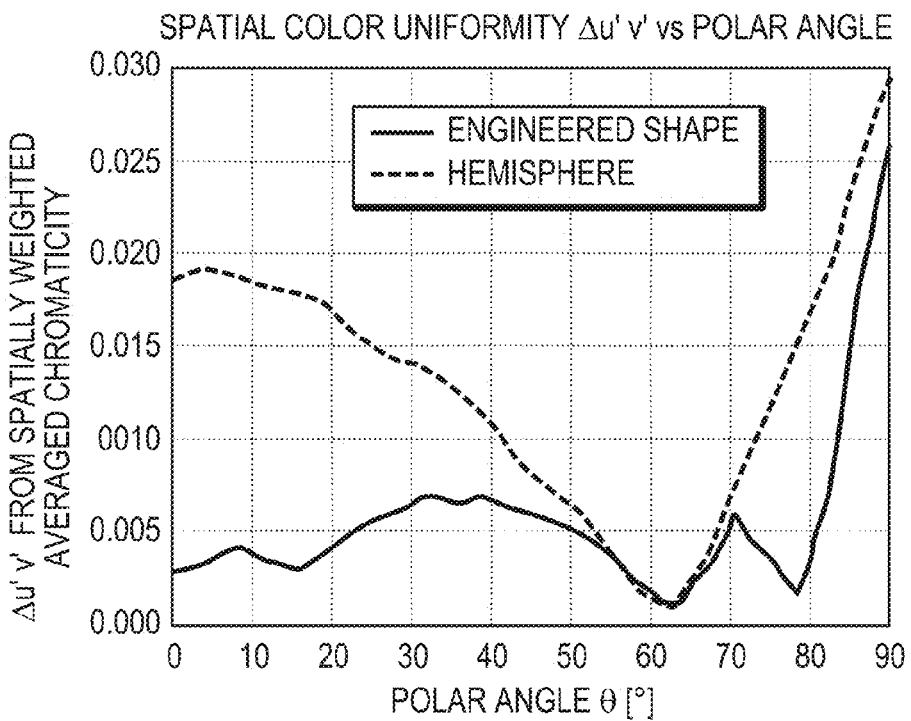
FIG. 9 is a plot of chromaticity deviation for light-emitting devices incorporating a hemispherical phosphor element or an engineered phosphor element in accordance with various embodiments of the invention.

Example 2 is one embodiment of the approach discussed above. FIG. 9 shows the deviation in chromaticity Δu'v' from the spatially averaged chromaticity as a function of angle for an engineered shape of a phosphor element similar to that shown in FIG. 3B. The deviation in chromaticity over a variety of angles was simulated using Monte Carlo ray-tracing techniques with ten million light rays. In this case, the shape of phosphor element 140 is defined as a function of a hemispherical profile with a radius of about 800 µm, centroid depth offset of about 410 µm (measured from the center of the bottom surface 315 of the LEE 130), circular flat-top of about 500 µm in diameter, and a cylindrical cut-off of about 1200 µm diameter. The characteristics of phosphor 140 and LEE 130 are the same as in Example 1. FIG. 9 also shows the deviation in chromaticity for a hemisphere with a radius of about 800 µm and centroid depth offset of about 0 µm, showing poorer performance (i.e., greater deviation in chromaticity) of the hemisphere compared to the engineered shape.

The discussion above has focused on hemispherical-shaped phosphor elements 130; however, this is not a limitation of the present invention, and in other embodiments phosphor element 130 may be defined by other shapes. For example, phosphor element 130 may have a top surface that defines a portion of an oblate ellipsoid.

Example 3

Figure 10:
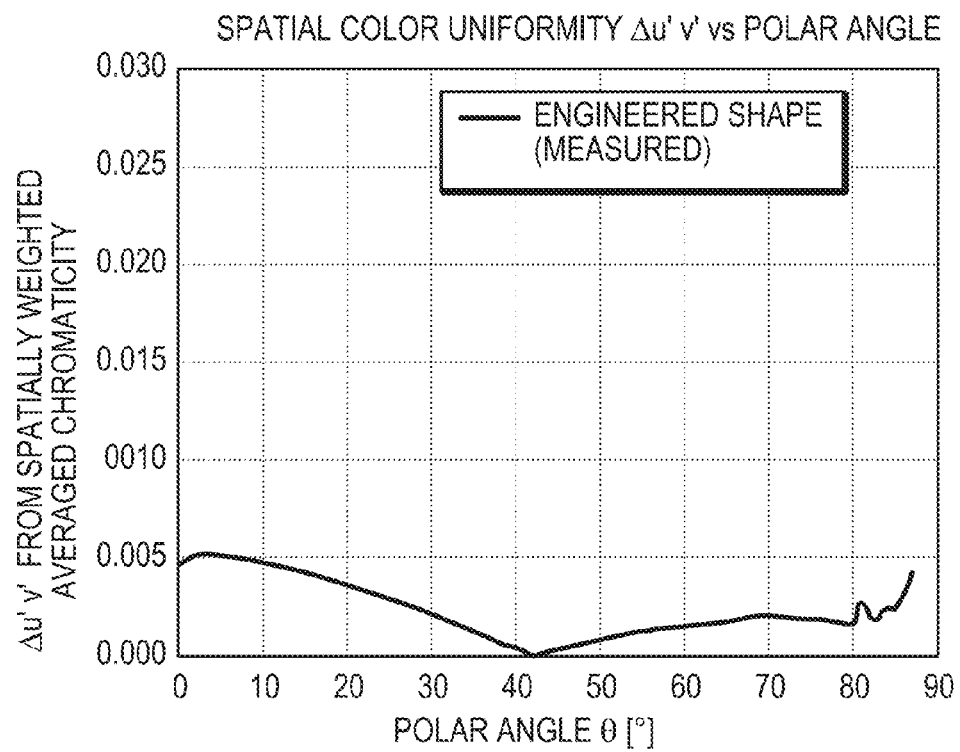
FIG. 10 is a plot of measured chromaticity deviation for light-emitting devices incorporating an engineered phosphor element in accordance with various embodiments of the invention.

FIG. 10 shows the measured deviation in chromaticity Δu'v' from the spatially average chromaticity as a function of angle for an engineered shape of a phosphor element similar to that shown in FIG. 3B. In this case the shape of portion 330 of the phosphor element 140 is defined as a function corresponding to an oblate ellipsoid profile described by the equation:

$$z(r) = \frac{r^2}{R\left(1 + \sqrt{1 - (1+K)(r^2/R^2)}\right)}$$

where r is the horizontal distance measured radially from the central axis, z is the distance (at r) to the surface, measured vertically with respect to the horizontal plane that touches the surface at r=0, R=2.38, and K=6.0. The phosphor element 140 has a refractive index of about 1.53 with a transmission spectrum shown in FIG. 4B. The phosphor emission spectrums targets a 3500 K CCT at about 0.4 chromaticity x value and at about 0.4 chromaticity y value, the phosphor has the same characteristics as discussed in Example 1 and LEE 130 has the same dimensions and characteristics as in Example 1. As may be seen from FIG. 10, the measured deviation in chromaticity Δu'v' from the spatially average chromaticity as a function of angle is significantly lower than that for the hemisphere (shown in FIG. 9).

An oblate ellipsoid is mathematically defined by the quadratic equation:

$$\frac{x^2}{a^2} + \frac{y^2}{b^2} + \frac{z^2}{c^2} = 1 \text{ where } a = b$$

$x^2/a^2 + y^2/b^2 + z^2/c^2 = 1$ where a=b
and has a shape intermediate between a hemisphere and a paraboloid. A particular advantage of an ellipsoid over a more complicated shape (as described for example by a higher order cubic or quatric equation) is that it has a smoother shape. This smoothness is preferred order to avoid discontinuities in the spatial distribution that are visible as caustics. (The rings of light visible in the projected beams from MR16 halogen lamps are a good example.)

As discussed above, preferred embodiments of the invention position the LEE away from the center of an oblate ellipsoid (such as, for example, the center of a hemisphere). Positioning the LEE at the center generally maximizes the symmetry of the LEE such that all light paths (including scattering and absorption/emission) are substantially the same, thus preventing the modification of the light paths to achieve improved angular uniformity. Preferred embodiments also position the LEE away from the surface of the oblate ellipsoid. When the LEE is at the surface, there is typically an insufficient mean free path between the LEE and the phosphor boundary to adequately balance the ratio of blue light and phosphor emissions to generate white light. Various embodiments of the invention feature a rectangular LEE whose length is greater than approximately twice its width and a phosphor element having the shape of a tri-axial ellipsoid where c>b>a.

Figure 11:
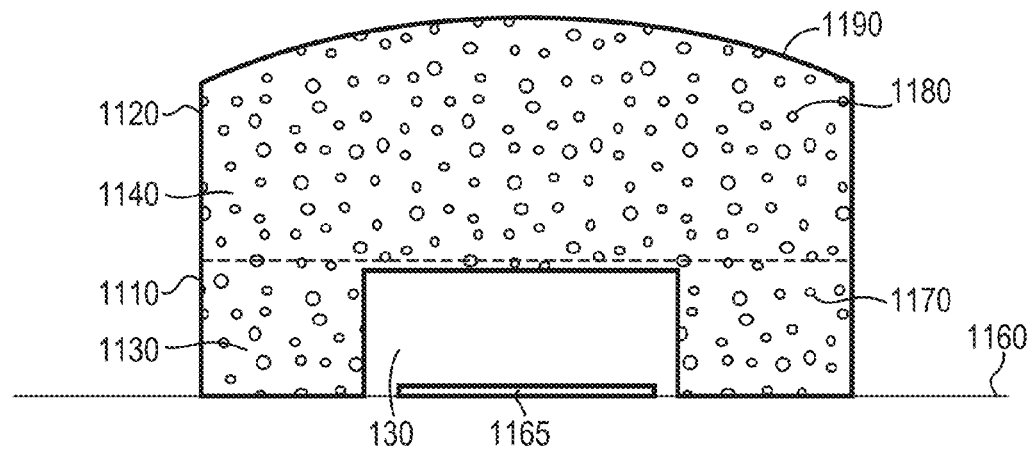
FIG. 11 is a schematic cross-section of a light-emitting device incorporating multiple phosphor regions in accordance with various embodiments of the invention.

In another embodiment, LEE 130 may be embedded or partially embedded in a series of multiple phosphor elements. For example, in one embodiment, a phosphor element 1110 and a phosphor element 1120 may be formed over or partially formed over LEE 130, as shown in FIG. 11. In one embodiment, phosphor element 1110 is different from phosphor element 1120. The differences between phosphor element 1110 and 1120 may include a different binder material, a different type of phosphor particle (1170, 1180) or particles, a different index of refraction, different concentrations of phosphor particles, or the like.

In some embodiments, a reflective surface, for example surfaces 1160 and/or 1165, may be formed below all or a portion of LEE 130 and/or phosphors 1110, 1120. In some embodiments, surface 1160 may include or consist essentially of a diffuse or specular reflector. In one embodiment, surface 1160 may include or consist essentially of a metal, for example aluminum, copper, silver, gold or the like. In some embodiments, surface 1160 may include or consist essentially of a diffuse reflector, such as a white surface, for example a white ink, or material such as multicellular polyethylene terephthalate (MCPET) or polyester. In some embodiments, reflective surface 1165, as shown in FIG. 11, may be incorporated into LEE 130.

More generally, the two or more phosphor element binders may have different refractive indices. If, for example, a first phosphor element binder 1140 has a lower refractive index than a second phosphor element binder 1130, TIR may occur at their boundary, thereby increasing the amount of blue light redirected to the sides of the first phosphor element. Alternatively, if the two or more optical elements are adhered with a glue or adhesive, the optical glue material may have a higher refractive index, thereby increasing the TIR at the boundary. In addition, the boundary between the first and second phosphor elements may include a dichroic mirror that is transparent to blue light but which reflects longer wavelengths.

Example 4

FIG. 11 depicts an LEE die 130 that has a length of about 325 μm, a width of about 200 um and a height of about 135 μm, as well as a mirror or reflective surface 1165 having dimensions of about 205 μm long and 150 μm wide. In this example, mounting surface 1160 (on which the LEE die 130 is mounted) has a reflectivity of about 95% to about 98% over the visible wavelength range, and may include or consist essentially of a material such as MCPET. Phosphor element 1110, disposed around the LEE die 130, includes binder 1130 into which are dispersed phosphor particles 1170. In this example, binder 1130 includes or consists essentially of a silicone and has a refractive index of about 1.57. Phosphor element 1110 is about 1200 μm long, about 1200 μm wide and about 165 μm tall.

Second phosphor element 1120, which is disposed over the top surface of the LEE die 130, includes or consists essentially of, in this example, a silicone binder 1140 with a refractive index of about 1.57 and containing phosphor particles 1180 with a density that is about 33% greater than that of the phosphor element 1110. The phosphor element 1120 may be optically bonded to the top surface of phosphor element 1110. Phosphor element 1120 is about 1200 μm long and about 1200 μm wide with a maximum height of about 435 μm.

A curved upper surface 1190 of the phosphor element 1120 has an oblate ellipsoid profile described by the equation:

$$z(r) = \frac{r^2}{R(1 + \sqrt{1 - (1+K)(r^2/R^2)})}$$

where r is the radius, z is the height (measured from the center of the top surface), R=2.38 and K=6.0. The profile was determined by iterative numerical simulations to provide an optimal distribution of blue and yellow light that minimizes chromaticity variations with respect to the viewing angle θ.

Figure 12A:
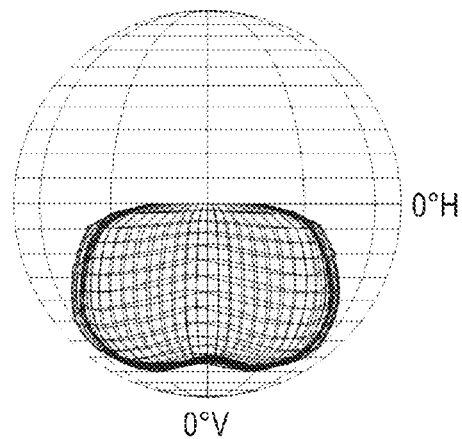
FIGS. 12A and 12B are plots of the simulated spectral radiant intensity distribution of blue and yellow light, respectively, that exit the phosphor regions of FIG. 6.
Figure 12B:
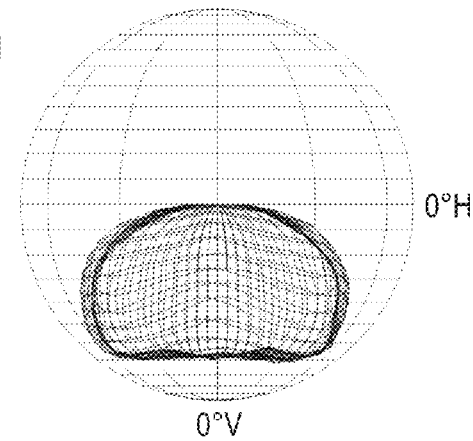
Figure 12C:
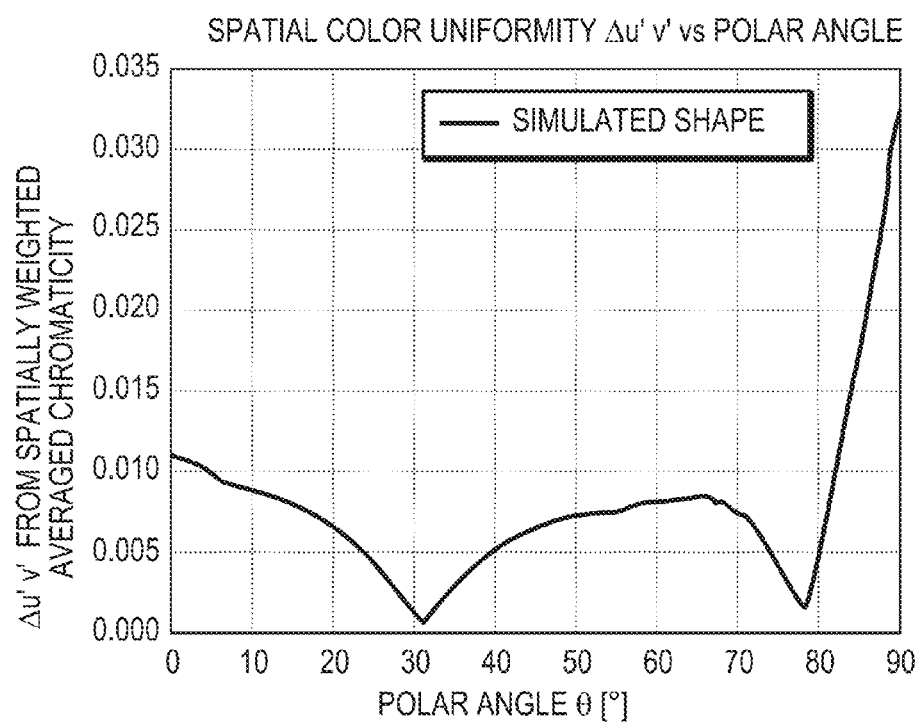
FIG. 12C is a plot of chromaticity deviation for the light-emitting device of FIG. 6.

FIGS. 12A and 12B show the simulated spectral radiant intensity distribution of the blue and yellow light, respectively, that exit both the first and second phosphor matrices. As shown, the radiant intensity distributions of blue and yellow light in FIGS. 12A and 12B are quite similar to each other, indicating that this system has relatively uniform chromaticity over a large range of viewing angles. FIG. 12C shows the deviation in chromaticity Δu'v' from the spatially average chromaticity as a function of angle for Example 4.

In another embodiment of the present invention, a color equalization layer (CEL) is interposed between the LEE and the phosphor. The CEL refers to a structure located between the LEE and the phosphor that includes or consists essentially of a material of lower absorption coefficient than the phosphor. The shape or absorption properties of the CEL are designed to provide angular modulation of the absorption of the LEE light, in such a way that the angular distribution of the LEE light intensity after passing through the phosphor is more closely matched to the angular distribution of the converted light. The CEL and the surrounding phosphor are typically index matched or substantially index matched to eliminate or substantially eliminate TIR at their interface. In one embodiment, the CEL may include or consist essentially of a substantially optically transparent material (the binder) or a material having a lower absorption efficiency than the phosphor element. In one embodiment, the CEL may also be a phosphor material (e.g., a binder having therewithin a plurality of phosphor or other wavelength-conversion particles) and have a lower absorption efficiency than that of the outer phosphor element. Preferred embodiments of the invention provide an interface adjacent to two or more index-matched or nearly index-matched regions, which may be shaped as required to optimize color uniformity while minimizing TIR or other effects that may impact extraction efficiency or other performance characteristics of the phosphor-converted package.

Figure 13A:
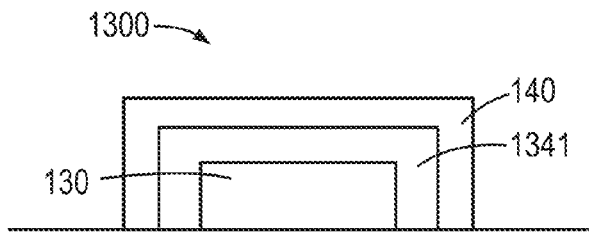
FIGS. 13A-13C are schematic cross-sections of portions of light-emitting devices incorporating color equalization layers in accordance with various embodiments of the invention.
Figure 13B:
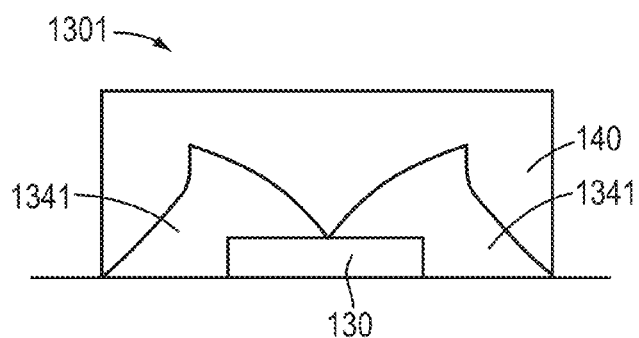
Figure 13C:
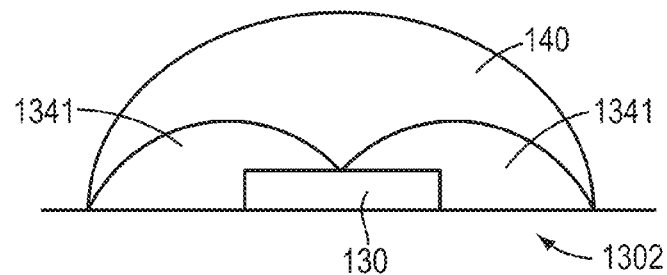

FIGS. 13A-13C depict exemplary illumination systems 1300, 1301, and 1302, respectively, in accordance with embodiments of the present invention, although alternative systems with similar functionality are also within the scope of the present invention. As may be seen from FIGS. 13A-13C, a CEL 1341 is disposed between LEE 130 and phosphor 140. In various embodiments, the optical properties of CEL 1341 may be homogeneous and the shape of CEL may be varied to provide the desired modification of the angular intensity distribution of light emitted by the LEE, as shown in FIGS. 13B and 13C. As may be seen schematically in FIGS. 13B and 13C, the exterior shape of phosphor 140 may be varied as well, and the shape of CEL 1341 is preferably modified accordingly. Procedures for determining the shape of CEL 1341 are provided herein. In other embodiments, CEL 1341 may have a relatively arbitrary shape, for example conformably similar to LEE 130 and/or phosphor 140 and have inhomogeneous optical properties, for example absorption or scattering, to provide the desired modification of the angular intensity distribution of light emitted by the LEE, as shown in FIG. 13A.

The inventors have found that a key aspect of the shapes of the CEL 1341 is that the thickness of the CEL measured vertically from the plane parallel to and intersecting the bottom surface of LEE 130, has a maximum thickness at a position intermediate between the center of LEE 130 and the outer edge of the CEL 1341 or phosphor 140. In some embodiments, the thickness of the CEL 1341 is zero or substantially zero at the center of LEE 130 (as shown in FIGS. 13B and 13C). Thus, the shape of CEL 1341 may be described as optionally starting on the surface of LEE 130 at the center of LEE 130, increasing monotonically towards the edge of LEE 130, reaching a maximum thickness after passing the edge of LEE 130, and then decreasing monotonically until reaching the plane parallel to the bottom surface of LEE 130. Note that this description is for one-half of the rotationally symmetric shape, starting at the center of the structure. The full three-dimensional shapes of CEL 1341 and phosphor 140 are realized by rotating the cross-section about the y-axis.

Example 5

Example 5 is based on the structure shown in FIG. 13B. Phosphor 140 has a cylindrical shape with the axis of the cylinder aligned with the center of LEE 130. Phosphor 140 has a height of about 0.5 mm and a diameter of about 1 mm. In this embodiment, CEL 1341 is optically transparent and is substantially the same as the binder in phosphor 140. LEE 130 is a cylindrical disk having a height of about 0.1 mm and a radius of about 0.2 mm. The shape of the interface between CEL 1341 and phosphor 140 is engineered to minimize the difference in (1) the angular intensity distribution of the light emitted from LEE 130 as it exits phosphor 140 and (2) the angular intensity distribution of wavelength-converted light emitted from phosphor 140 such that they are the same or substantially the same.

Example 6

Example 6 is based on the structure shown in FIG. 13C. Phosphor 140 has a hemispherical shape with the axis of the hemisphere aligned with the center of LEE 130. The hemispherical shape may result in increased light output power because of reduced TIR at the interface between phosphor 140 and air. Phosphor 140 has a radius of about 1 mm. In this embodiment, CEL 1341 is optically transparent and is substantially the same as the binder in phosphor 140. LEE 130 is a cylindrical disk having a height of about 0.1 mm and a radius of about 0.2 mm. The shape of the interface between CEL 1341 and phosphor 140 is engineered to minimize the difference in (1) the angular intensity distribution of the light emitted from LEE 130 as it exits phosphor 140 and (2) the angular intensity distribution of wavelength-converted light emitted from phosphor 140 such that they are the same or substantially the same.

Using these principles, the shape of CEL 1341 may be determined without undue experimentation by one skilled in the art by first determining the radiant flux distribution pattern of LEE 130 as a function of angle, simulating the entire structure to determine the angular intensity distribution of blue light emitted from the outer surface of phosphor 140 and then adjusting the boundary between CEL 1341 and phosphor 140 such that the angular intensity distribution of blue light emitted through the outer surface of the phosphor 140 substantially matches the angular distribution of the phosphor-converted light emitted from phosphor 140.

Figure 14:
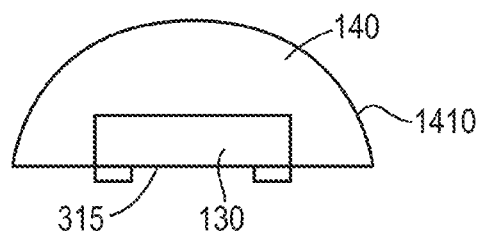
FIG. 14 is a schematic cross-section of a portion of a light-emitting device in accordance with various embodiments of the invention.

In some embodiments, the interior and/or exposed surfaces of the phosphor and/or binder may be smooth or textured, depending on the desired intensity distribution. Additionally, these surfaces may be intentionally roughened or textured, for example, to further control the desired intensity distribution. Such modification of the various surfaces may also be used to increase the light-extraction efficiency by reducing TIR. FIG. 14 shows an example of one embodiment of a structure in which the outer surface of phosphor 140 is roughened or textured, identified as surface 1410 in FIG. 14. While FIG. 14 shows all of the curved surface of phosphor 140 as being roughened or textured this is not a limitation of the present invention, and in other embodiments only a portion of phosphor 140 may be textured or roughened. Texturing or roughening of phosphor 140 may be accomplished by a variety of means, for example using ablation or etching, or phosphor 140 may be formed with a roughened or textured surface, for example by molding or casting. In some embodiments, the texturing or roughening may be random, while in other embodiments the texturing or roughening may be periodic. In some embodiments, the texturing or roughening may have a feature size in the range of about 0.1 µm to about 5 µm; however, the size and extent and density of texturing or roughening is not a limitation of the present invention.

In some embodiments, the structures described herein, including or consisting essentially of an LEE and a phosphor element, herein identified as an LEE/phosphor element, may be incorporated into packages to produce packaged LEEs with improved angular chromaticity uniformity. For example, FIGS. 15A-15E show examples of embodiments of LEE 130 and phosphor 140 incorporated into packaged devices.

Figure 15A:
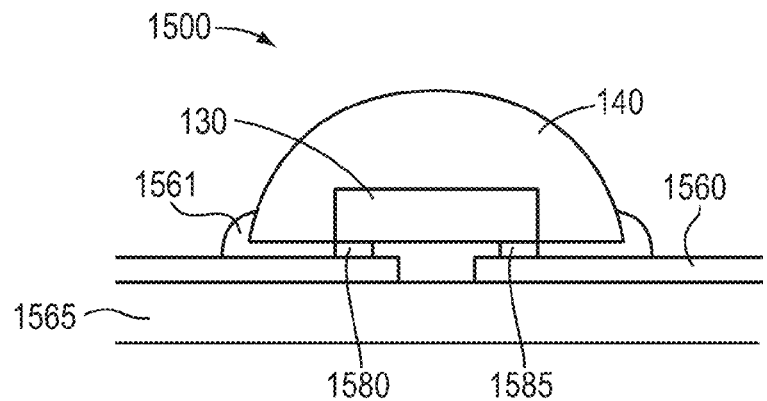
FIG. 15A-15E are schematic cross-sections of light-emitting devices in accordance with various embodiments of the invention.
Figure 15B:
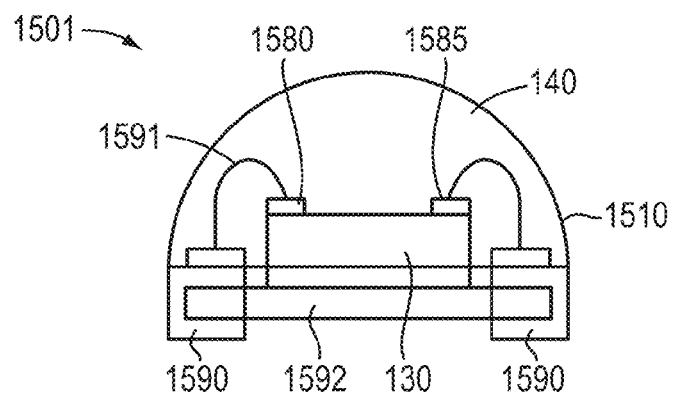
Figure 15C:
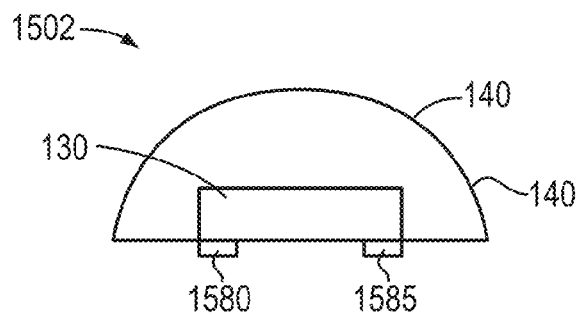

For example each LEE/phosphor element may be mounted on a base or substrate, as identified as 1565 and 1592 in FIGS. 15A and 15B respectively; however, this is not a limitation of the present invention, and in other embodiments LEE/phosphor elements within the scope of this invention may be unmounted or unpackaged, for example as shown in FIG. 15C. FIG. 15C shows an example of a structure identified as a white die 1502 that includes or consists essentially of an LEE 130 and a phosphor 140. White die 1502 is described in U.S. patent application Ser. No. 13/748,864, filed on Jan. 24, 2013, the entire disclosure of which is herein incorporated by reference.

Figure 15D:
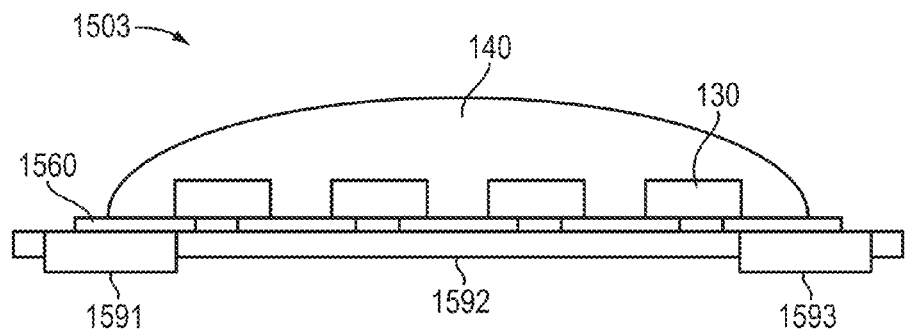

In some embodiments of the present invention, contacts 1580, 1585 of LEE 130 may be electrically coupled and/or attached to conductive traces or conductive elements, as identified as 1560 or 1590 in FIGS. 15A and 15B respectively. Contacts 1580, 1585 of LEE 130 may be electrically coupled and/or attached to conductive traces 1560 or 1590 using a variety of means; the method of electrical coupling and/or attachment is not a limitation of the present invention. In some embodiments, contacts 1580, 1585 of LEE 130 may be electrically coupled and/or attached to conductive traces 1560 or 1590 using a conductive adhesive, a conductive paste, an anisotropic conductive film, or another type of anisotropic conductive adhesive (ACA), as shown in FIG. 15A. In some embodiments, contacts 1580, 1585 of LEE 130 may be electrically coupled and/or attached to conductive traces 1560 or 1590 using wire bonds 5191 as shown in FIG. 15B. In some embodiments, LEE 130 may be attached to conductive traces 1560 or 1590 using a conductive adhesive and/or a non-conductive adhesive. In some embodiments, contacts 1580, 1585 of LEE 130 may be electrically coupled and/or attached to conductive traces 1560 or 1590 using a solder process, eutectic solder process, wave solder process, or a solder reflow process. In some embodiments, LEE 130 may be electrically coupled and/or attached to conductive traces 1560 or 1590 in a flip-chip orientation, for example as shown in FIGS. 15A and 15D. The method of electrical coupling and/or attachment of contacts 1580, 1585 to conductive traces 1560 or 1590 is not a limitation of the present invention.

Figure 15E:
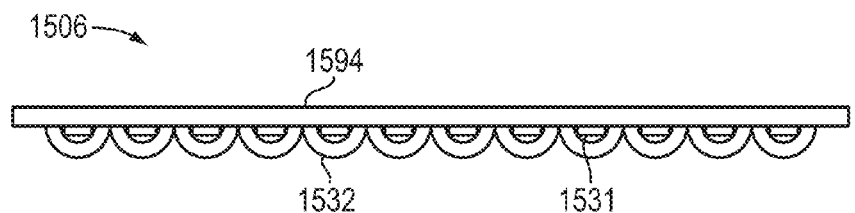

The structures shown in FIGS. 15A-15C include one LEE 130; however, this is not a limitation of the present invention, and in other embodiments the structure may include multiple LEEs 130, as shown in FIG. 15D. FIG. 15D shows a structure 1503 that includes a substrate 1592 over which has been formed conductive elements 1560 and to which contacts 1580 and 1585 (not shown for clarity) of LEEs 130 have been electrically coupled. The structure shown in FIG. 15D may also be referred to as a chip-on-board structure. Contacts 1580 and 1585 may be attached using a variety of means, for example wire bonding, solder, adhesive, and the like. Exemplary structure 1503 includes four LEEs 130; however, this is not a limitation of the present invention, and in other embodiments structure 1503 may include any number of LEEs 130, e.g., 10 or 20. Structure 1503 also includes package contacts 1591, 1593 to which conductive elements 1560 are electrically coupled and which are typically electrically connected to an external power source. FIG. 15E shows a structure including more than one LEE/phosphor element structure, featuring a line or array of LEE/phosphor element structures formed over a substrate 1594. In some embodiments, phosphor element 140 may have a radius of at least 2 mm, or at least 5 mm. In some embodiments, for example where phosphor element 140 encompasses more than one LEE 130 (for example as shown in FIG. 15D), phosphor element 140 may have a relatively larger radius, for example over 5 mm or over 10 mm or over 30 mm.

Substrates 1565 and 1592 may be composed of a wide range of materials. In some embodiments, substrates 1565 and 1592 may have relatively low thermal conductivities. In some embodiments, substrates 1565 and 1592 may have relatively high thermal conductivities. In some embodiments, substrates 1565 and 1592 may be flexible, while in others they may be substantially rigid. Substrate 1565 may include or consist essentially of a semicrystalline or amorphous material, e.g., polyethylene naphthalate (PEN), polyethylene terephthalate (PET), polycarbonate, polyethersulfone, polyester, polyimide, polyethylene, and/or paper. Substrate 1565 may include or consist essentially of multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate comprising, e.g., acrylic, aluminum, steel, and the like. Depending upon the desired application for which embodiments of the invention are utilized, substrate 1565 may be substantially optically transparent, translucent, or opaque. For example, substrate 1565 may exhibit a transmittance or a reflectivity greater than 70% for optical wavelengths ranging between approximately 400 nm and approximately 600 nm. In some embodiments, substrate 1565 may exhibit a transmittance or a reflectivity of greater than 70% for one or more wavelengths emitted by LEE 130 and or phosphor 140. Substrate 1565 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments, substrates 1565 or 1592 may include or consist essentially of materials such as fiberglass, FR4, metal, ceramic materials such as silicon carbide, aluminum nitride, aluminum oxide, combinations of these materials, and the like. In some embodiments, substrate 1565 or 1592 may include or consist essentially of a metal, for example a metal leadframe. In some embodiments, substrate 1565 or 1592 may include or consist essentially of a metal-core printed circuit board. The material and form of substrates 1565 or 1592 is not a limitation of the present invention.

Conductive elements 1560 and 1590 may be formed via conventional deposition, photolithography, and etching processes, plating processes, lamination, lamination and patterning, evaporation sputtering, chemical vapor deposition or the like, or they may be formed using a variety of printing processes. For example, conductive elements 1560 and 1590 may be formed via screen printing, flexographic printing, ink-jet printing, and/or gravure printing. Conductive elements 1560 and 1590 may include or consist essentially of a conductive ink, which may include one or more elements such as silver, gold, aluminum, chromium, copper, and/or carbon. Conductive elements 1560 and 1590 may include or consist essentially of a conductive material, which may include one or more elements such as silver, gold, aluminum, chromium, copper, and/or carbon. Conductive elements 1560 and 1590 may have a thickness in the range of about 50 nm to about 500 µm; however, the thickness of conductive elements 1560 and 1590 is not a limitation of the present invention. In some embodiments, all or a portion of conductive elements 1560 and 1590 may be covered or encapsulated. In some embodiments, a layer of material, for example insulating material, may be formed over all or a portion of conductive elements 1560 and 1590. Such a material may include or consist essentially of, for example, a sheet of material such as that used for substrate 1565, a printed layer, for example using screen, ink jet, stencil or other printing techniques, a laminated layer, or the like. Such a layer may include or consist essentially of, for example, an ink, a plastic and oxide or the like. The covering material and/or the method by which it is applied is not a limitation of the present invention.

In one embodiment, conductive traces 1560 may be formed so as to have a gap between adjacent conductive traces 1560, and LEEs 130 are electrically coupled to conductive traces 1560 using conductive adhesive, e.g., an isotropically conductive adhesive and/or an ACA 1561, for example as shown in FIG. 15A. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs.

Figure 16A:
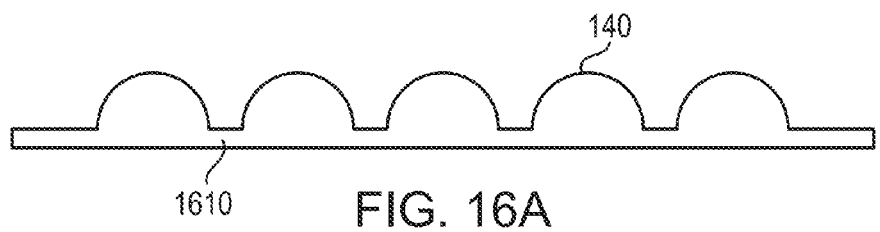
FIGS. 16A and 16B are schematic cross-sections of arrays of phosphor elements in accordance with various embodiments of the invention.
Figure 16B:
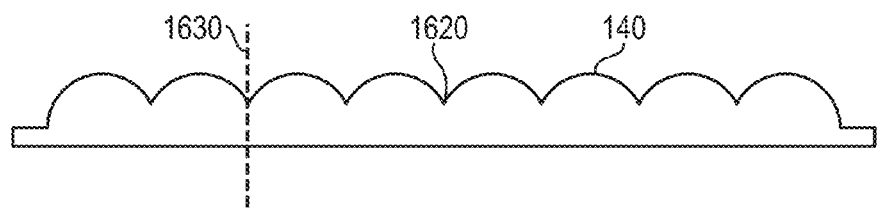
Figure 16C:
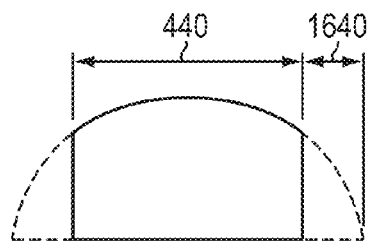
FIG. 16C is a schematic cross-section of a singulated phosphor element in accordance with various embodiments of the invention.

In some embodiments, the shape of phosphor element 140 is formed by casting or molding. In some embodiments, multiple phosphor elements may be formed separately. In some embodiments, multiple phosphor elements may be formed simultaneously. In some embodiments where multiple phosphor elements are formed simultaneously, each element 140 may be separated from adjacent shapes by a web 1610, for example as shown in FIG. 16A. In some embodiments, the elements may be formed in a merged fashion, for example as shown in FIG. 16B, where adjacent phosphor elements 140 are merged at an interface 1620. In some embodiments, the structure in FIG. 16B permits the manufacture of a larger number of phosphor elements 140 in a fixed area, as compared to the structure of FIG. 16A. In a subsequent manufacturing step, phosphor elements 140 shown in FIG. 16A or 16B may be separated or singulated. For example, the structure of FIG. 16B may be singulated at a cut line 1630. After singulation the structure may look like the example shown in FIG. 16C, having a cylindrical cutoff 440, as described in reference to FIG. 4A, and a removed portion having extent 1640, as shown in FIG. 16C. In some embodiments, the ratio of dimension 440 to the hemisphere diameter (which is two times the hemisphere radius) is in the range of about 0.95 to about 0.75. In some embodiments the cut-off portion is in the range of about 50 µm to about 500 µm.

Figure 17A:
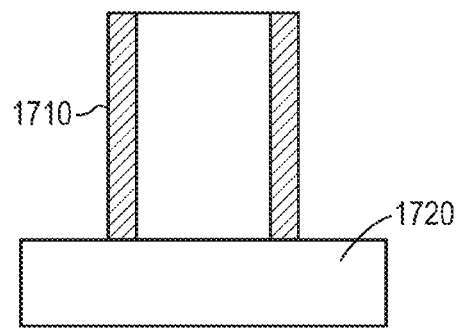
FIGS. 17A-17C are schematic cross-sections of pick-and-place tools interacting with light-emitting devices in accordance with various embodiments of the invention.
Figure 17B:
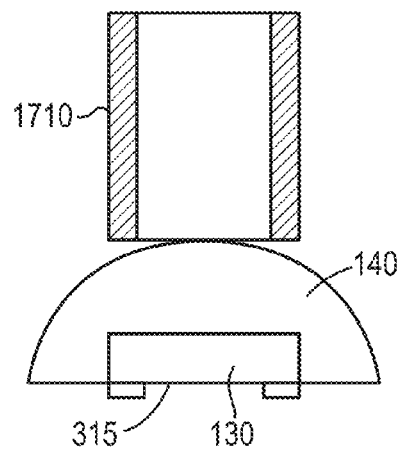
Figure 17C:
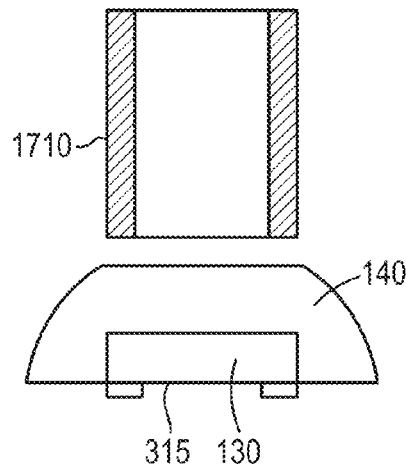

During the manufacture of structures described herein, for example structures shown in FIGS. 15A-15E, it may be necessary to move or pick up structures such as those shown in FIGS. 3A and 3B. In some embodiments, pick-and-place equipment may be used. Pick-and-place tools are conventionally used to pick up semiconductor dies. These may operate at very high speeds, for example at least 5000 units per hour or at least 10,000 units per hour. The pick-and-place equipment may have a vacuum tip that is applied to the flat top of each semiconductor die. When vacuum is applied to the vacuum tip, the semiconductor die is temporarily attached to the tip, and thus may be moved from one location to the next. A schematic of this is shown in FIG. 17A, showing vacuum tool 1710 and semiconductor die 1720. However, the curved top surface of phosphor element 140 may render it difficult to achieve a good seal between vacuum tool 1710 and phosphor element 140 as shown in FIG. 17B. In some embodiments, a flat top may be formed on the top of phosphor element 140, as shown in FIG. 17C, to provide a flat surface for sealing of vacuum tool 1710 to phosphor element 140. In some embodiments, the flat top may have a diameter in the range of about 50 µm to about 1000 µm; however, this is not a limitation of the present invention, and in other embodiments the flat top may be larger or smaller.

In an exemplary embodiment, LEE 130 represents a light-emitting element such as an LED or a laser, but other embodiments of the invention feature one or more semiconductor dies with different or additional functionality, e.g., processors, sensors, detectors, control elements, and the like. Non-LEE dies may or may not be bonded as described herein, and may have contact geometries differing from those of the LEEs; moreover, they may or may not have semiconductor layers disposed over a substrate as discussed below. LEE 130 may be composed of one or more layers, for example semiconductor layers formed over a substrate. The substrate may, for example, include or consist essentially of one or more semiconductor materials, e.g., silicon, GaAs, InP, GaN, and may be doped or substantially undoped (e.g., not intentionally doped). In some embodiments, the substrate includes or consists essentially of sapphire or silicon carbide; however, the composition of the substrate is not a limitation of the present invention. The substrate may be substantially transparent to a wavelength of light emitted by the LEE 130. For a light-emitting element, the semiconductor layers may include first and second doped layers which preferably are doped with opposite polarities (i.e., one n-type doped and the other p-type doped). One or more light-emitting layers e.g., or one or more quantum wells, may be disposed between the first and second doped layers. Each of these layers may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 130 is an inorganic, rather than a polymeric or organic, device.

In some embodiments, substantially all or a portion the substrate is removed from LEE 130. Such removal may be performed by, e.g., chemical etching, laser lift-off, mechanical grinding and/or chemical-mechanical polishing or the like. In some embodiments, all or a portion of the substrate is removed and a second substrate—e.g., one that is transparent to or reflective of a wavelength of light emitted by LEE 130—is attached to the substrate or semiconductor layers prior to or after the bonding of LEE 130 as described below. In some embodiments, the substrate includes or consists essentially of silicon and all or a portion of the silicon substrate may be removed prior to or after the bonding of LEE 130 to a conductive element or other system. Such removal may be performed by, e.g., chemical etching, laser lift off, mechanical grinding and/or chemical-mechanical polishing or the like.

Electrical contact to LEE 130 may be achieved through contacts which may make contact to the p- and n-layers respectively. LEE 130 may optionally feature a mirror or reflective surface formed over all or portions of the semiconductor layers and optionally other portions of LEE 130. The mirror may act to direct light emitted from the light emitting layer back towards and out the substrate, particularly in a flip-chip configuration, where LEE 130 is mounted contact-side down.

In some embodiments, the LEE 130 has a square shape, while in other embodiments LEE 130 has a rectangular shape. In some preferred embodiments, to facilitate bonding) LEE 130 has a shape with a dimension in one direction that exceeds a dimension in an orthogonal direction (e.g., a rectangular shape), and has an aspect ratio of the orthogonal directions (length to width, in the case of a rectangular shape) of LEE 130 greater than about 1.2:1. In some embodiments, LEE 130 has an aspect ratio greater than about 2:1 or greater than 3:1. The shape and aspect ratio are not critical to the present invention, however, and LEE 130 may have any desired shape.

While the discussion herein has mentioned blue LEDs and phosphors, that when combined produce white light, the concepts may be used with respect to LEDs emitting at any wavelength and phosphors or wavelength-conversion materials with any emission wavelengths that may in combination or alone be used to produce any color.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A light-emitting device comprising:
   a light-emitting die having (i) a top face and a bottom face opposite the top face, at least one of the top or bottom face being configured for emission of light therefrom, and (ii) a sidewall spanning the top and bottom faces; and
   at least partially surrounding the light-emitting die, a phosphor element comprising (i) a binder and (ii) disposed within the binder, one or more wavelength-conversion materials for absorbing at least a portion of light emitted from the light-emitting die and emitting converted light having a different wavelength, converted light combining with unconverted light emitted from the light-emitting die to form substantially white light, and a divergence of color temperature of the substantially white light emitted from the device varies, over an angular range of 0° to 85°, no more than 0.01 in terms of Δu'v' deviation from a spatially weighted averaged chromaticity,
   wherein the phosphor element has an outer contour having (i) a curved region that defines only a portion of a hemisphere having a hemisphere radius, (ii) a planar region (a) disposed over the light-emitting die, (b) having a non-zero z-offset within the hemisphere, and (c) substantially parallel to the top face of the light-emitting die, a ratio of the z-offset of the planar region within the hemisphere to the hemisphere radius having a value ranging from 0.02 to 0.15, and (iii) a base opposite the planar region having a non-zero centroid z-offset within the hemisphere, a ratio of the centroid z-offset to the hemisphere radius having a value ranging from 0.3 to 0.8.

2. The light-emitting device of claim 1, wherein the bottom face of the light-emitting die is substantially coplanar with the base of the phosphor element opposite the planar region.

3. The light-emitting device of claim 1, wherein the ratio of the z-offset of the planar region within the hemisphere to the hemisphere radius is a value ranging from 0.04 to 0.12.

4. The light-emitting device of claim 1, wherein the outer contour of the phosphor element has a region defined by a cylindrical cutoff within the hemisphere.

5. The light-emitting device of claim 4, wherein a ratio of a length of the cylindrical cutoff to the hemisphere radius is a value ranging from 0.75 to 0.95.

6. The light-emitting device of claim 5, wherein the length of the cylindrical cutoff is a value ranging from 50 μm to 500 μm.

7. The light-emitting device of claim 4, wherein a length of the cylindrical cutoff is a value ranging from about 0.2 mm to about 20 mm.

8. The light-emitting device of claim 1, wherein the hemisphere radius is a value ranging from about 0.5 mm to about 5 mm.

9. The light-emitting device of claim 1, wherein (i) light emitted from the light-emitting die has a Lambertian distribution and (ii) the converted light has an isotropic distribution.

10. The light-emitting device of claim 1, wherein the divergence of color temperature of the substantially white light emitted from the device varies, over an angular range of 0° to 85°, no more than 0.005 in terms of Δu'v' deviation from a spatially weighted averaged chromaticity.

11. The light-emitting device of claim 1, wherein the one or more wavelength conversion materials comprise one or more phosphor particles.

12. The light-emitting device of claim 1, further comprising, disposed beneath at least one of (i) at least a portion of the light-emitting die or (ii) the phosphor element, a mounting surface reflective to at least one of converted light or unconverted light emitted by the light-emitting die.

13. The light-emitting device of claim 12, wherein the mounting surface has a reflectivity to visible light of approximately 95% to approximately 98%.

14. The light-emitting device of claim 1, wherein at least a portion of the outer contour of the phosphor element has a surface texture for reducing total internal reflection.

15. The light-emitting device of claim 1, wherein the light-emitting die is a bare light-emitting diode die.

16. The light-emitting device of claim 1, wherein the light-emitting die comprises a GaN-based semiconductor material.

17. The light-emitting device of claim 1, wherein the light-emitting die emits blue or ultraviolet light.

18. The light-emitting device of claim 1, wherein the hemisphere radius is a value ranging from about 0.2 mm to about 20 mm.

19. The light-emitting device of claim 1, wherein the ratio of the centroid z-offset to the hemisphere radius has a value ranging from 0.5 to 0.77.

20. The light-emitting device of claim 1, wherein the ratio of the centroid z-offset to the hemisphere radius has a value ranging from 0.3 to 0.5.

21. The light-emitting device of claim 1, wherein the planar region has a radius having a value ranging from 50 μm to 1000 μm.

22. The light-emitting device of claim 1, wherein the ratio of the z-offset of the planar region within the hemisphere to the hemisphere radius is approximately defined by $-1.9 \times F + 0.67$, where F is a ratio of the z-offset value of the planar region within the hemisphere to the hemisphere radius.

23. The light-emitting device of claim 1, wherein the z-offset of the planar region within the hemisphere is approximately defined by $1.41 \times R - 0.8$, where R is the hemisphere radius.

24. The light-emitting device of claim 1, wherein (i) the phosphor element has a base radius having a value ranging from 0.6 mm and 1.0 mm, (ii) the planar region has a radius having a value ranging from about 0.15 mm to about 0.45 mm, and (iii) a height from a base of the phosphor element to the planar region is a value ranging from about 0.15 mm to about 0.5 mm.

25. The light-emitting device of claim 1, further comprising at least one additional light-emitting die at least partially surrounded by the phosphor element.

26. The light-emitting device of claim 1, further comprising:
- a second light-emitting die having (i) a top face and a bottom face opposite the top face, at least one of the top or bottom face being configured for emission of light therefrom, and (ii) a sidewall spanning the top and bottom faces; and
- at least partially surrounding the second light-emitting die, a second phosphor element comprising (i) a binder and (ii) disposed within the binder, one or more wavelength-conversion materials for absorbing at least a portion of light emitted from the second light-emitting die and emitting converted light having a different wavelength, converted light combining with unconverted light emitted from the second light-emitting die to form substantially white light,
- wherein the second phosphor element has an outer contour having (i) a curved region that defines only a portion of a hemisphere having a hemisphere radius, (ii) a planar region (a) disposed over the light-emitting die, (b) having a non-zero z-offset within the hemisphere, and (c) substantially parallel to the top face of the light-emitting die, a ratio of the z-offset of the planar region within the hemisphere to the hemisphere radius having a value ranging from 0.02 to 0.15, and (iii) a base opposite the planar region having a non-zero centroid z-offset within the hemisphere, a ratio of the centroid z-offset to the hemisphere radius having a value ranging from 0.3 to 0.8.

27. The light-emitting device of claim 26, wherein the phosphor element and the second phosphor element are separated by a web therebetween, the web comprising the binder.

28. The light emitting-device of claim 1, further comprising a substrate having a plurality of conductive elements disposed thereon, wherein (i) the light-emitting die has at least two contacts on the bottom face, and (ii) each contact on the bottom face is electrically coupled to a different conductive element on the substrate.

29. The light-emitting device of claim 28, wherein each contact on the bottom face of the light-emitting die is electrically coupled to a different conductive element via at least one of a conductive adhesive, an anisotropic conductive adhesive, a wire bond, or solder.

30. A light-emitting device comprising:
- a light-emitting die having (i) a top face and a bottom face opposite the top face, at least one of the top or bottom face being configured for emission of light therefrom, and (ii) a sidewall spanning the top and bottom faces; and
- at least partially surrounding the light-emitting die, a phosphor element comprising (i) a binder and (ii) disposed within the binder, one or more wavelength-conversion materials for absorbing at least a portion of light emitted from the light-emitting die and emitting converted light having a different wavelength, converted light and unconverted light emitted by the light-emitting die combining to form substantially white light,
- wherein the phosphor element comprises (i) a first region having a sidewall substantially parallel to the sidewall of the light-emitting die and (ii) disposed over the first region, a second region having a top surface defining a portion of an oblate ellipsoid described by the equation $$z(r) = \frac{r^2}{R\left(1 + \sqrt{1 - (1+K)(r^2/R^2)}\right)},$$

where z is a height of the second region above a top surface of the light-emitting die, r is a radius of the oblate ellipsoid, R is approximately 2.38, and K is approximately 6.0.

* * * * *